US011079526B2

(12) United States Patent
Mita et al.

(10) Patent No.: US 11,079,526 B2
(45) Date of Patent: Aug. 3, 2021

(54) POLARIZING FILM, PRESSURE-SENSITIVE-ADHESIVE-LAYER-ATTACHED POLARIZING FILM, METHOD FOR PRODUCING POLARIZING FILM, AND IMAGE DISPLAY DEVICE

(71) Applicant: NITTO DENKO CORPORATION, Ibaraki (JP)

(72) Inventors: Satoshi Mita, Ibaraki (JP); Tomonori Ueno, Ibaraki (JP); Jingfan Xu, Ibaraki (JP); Atsushi Kishi, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 402 days.

(21) Appl. No.: 16/086,076

(22) PCT Filed: Mar. 17, 2017

(86) PCT No.: PCT/JP2017/010973
§ 371 (c)(1),
(2) Date: Sep. 18, 2018

(87) PCT Pub. No.: WO2017/169916
PCT Pub. Date: Oct. 5, 2017

(65) Prior Publication Data
US 2020/0292738 A1    Sep. 17, 2020

(30) Foreign Application Priority Data
Mar. 28, 2016   (JP) .............................. JP2016-063498

(51) Int. Cl.
*G02B 5/30*   (2006.01)
*G02B 1/14*   (2015.01)
*G02F 1/1335* (2006.01)

(52) U.S. Cl.
CPC ................. *G02B 5/30* (2013.01); *G02B 1/14* (2015.01); *G02F 1/133528* (2013.01)

(58) Field of Classification Search
CPC ........... G02B 5/30; G02B 5/3033; G02B 1/14
(Continued)

(56) References Cited

U.S. PATENT DOCUMENTS 8,411,360 B2 * 4/2013 Kitagawa ................ B29C 65/00
                                                   359/487.06
10,067,268 B2 * 9/2018 Mita ......................... C08K 3/01
(Continued)

FOREIGN PATENT DOCUMENTS

CN   101285906 A   10/2008
CN   104046286 A   9/2014
(Continued)

OTHER PUBLICATIONS

Notification of Transmittal of Translation of the International Preliminary Report on Patentability (Form PCT/IB/338) issued in counterpart International Application No. PCT/JP2017/010973 dated Oct. 11, 2018, with Forms PCT/IB/373 and PCT/ISA/237. (11 pages).
(Continued)

*Primary Examiner* — Ricky D Shafer
(74) *Attorney, Agent, or Firm* — Westerman, Hattori, Daniels & Adrian, LLP

(57) ABSTRACT

A polarizing film is disclosed including a polarizer having a thickness of 10 μm or less, and a transparent resin layer on at least one surface of the polarizer,
  wherein the polarizer includes a polyvinyl alcohol-based resin, and has a single-body transmittance T and a polarization degree P representing optical properties satisfying the condition of the following formula:

$P > -(10^{0.929T-42.4}-1) \times 100$ (provided that $T<42.3$) or
$P \geq 99.9$ (provided that $T \geq 42.3$), and (Continued)

the transparent resin layer is a formed product of a transparent resin layer forming material including a water-based emulsion resin and has a hardness of 0.01 GPa or more. The polarizing film, using a thin-polarizer, can suppress the occurrence of defects such as nano-slits and is further restrained from being lowered in optical properties in a heating and humidifying test to have a high optical reliability.

10 Claims, 4 Drawing Sheets

(58) Field of Classification Search
USPC .................................. 359/487.01, 487.02
See application file for complete search history.

(56) References Cited

U.S. PATENT DOCUMENTS

| | | | |
|---|---|---|---|
| 10,088,705 B2 * | 10/2018 | Miyai | G02F 1/133528 |
| 10,094,954 B2 * | 10/2018 | Xu | G02B 1/14 |
| 10,345,500 B2 * | 7/2019 | Motegi | G02B 5/305 |
| 10,754,065 B2 * | 8/2020 | Namiki | H01L 51/5281 |
| 2005/0084670 A1 | 4/2005 | Satake et al. | |
| 2011/0043733 A1 * | 2/2011 | Suzuki | G02F 1/133528 349/96 |
| 2012/0055607 A1 | 3/2012 | Kitagawa et al. | |
| 2012/0055608 A1 | 3/2012 | Kitagawa et al. | |
| 2012/0055621 A1 | 3/2012 | Goto | |
| 2012/0055622 A1 | 3/2012 | Kitagawa et al. | |
| 2012/0055623 A1 | 3/2012 | Kitagawa et al. | |
| 2012/0056211 A1 | 3/2012 | Kitagawa et al. | |
| 2012/0056340 A1 | 3/2012 | Kitagawa et al. | |
| 2012/0057104 A1 | 3/2012 | Kitagawa et al. | |
| 2012/0057231 A1 | 3/2012 | Goto et al. | |
| 2012/0058291 A1 * | 3/2012 | Kitagawa | G02B 27/288 428/43 |
| 2012/0058321 A1 | 3/2012 | Goto | |
| 2014/0272200 A1 | 9/2014 | Akizuki et al. | |
| 2015/0301403 A1 | 10/2015 | Oba et al. | |
| 2016/0018578 A1 * | 1/2016 | Yonemoto | B32B 7/12 359/487.02 |
| 2016/0130478 A1 | 5/2016 | Nagata et al. | |
| 2017/0210915 A1 * | 7/2017 | Lee | G02B 5/3033 |
| 2017/0299779 A1 * | 10/2017 | Mita | C09J 129/04 |

FOREIGN PATENT DOCUMENTS

| | | |
|---|---|---|
| EP | 1 933 181 A1 | 6/2008 |
| JP | 2003-307624 A | 10/2003 |
| JP | 2004-37841 A | 2/2004 |
| JP | 2005-70139 A | 3/2005 |
| JP | 2005-206689 A | 8/2005 |
| JP | 2005-344022 A | 12/2005 |
| JP | 2008-261914 A | 10/2008 |
| JP | 2009-241283 A | 10/2009 |
| JP | 2010-9027 A | 1/2010 |
| JP | 2010-204622 A | 9/2010 |
| JP | 2011-39363 A | 2/2011 |
| JP | 4751481 B1 | 8/2011 |
| JP | 2013-160775 A | 8/2013 |
| JP | 2014078016 A | 5/2014 |
| JP | 2015-071740 A | 4/2015 |
| JP | 2015-212815 A | 11/2015 |
| JP | 2010039363 A | 2/2018 |
| TW | 200717045 A | 5/2007 |
| TW | 201307907 A | 1/2013 |
| WO | 2016/018103 A1 | 2/2016 |
| WO | 2017/169917 A1 | 10/2017 |

OTHER PUBLICATIONS

Office Action dated Feb. 25, 2020, issued in counterpart KR Application No. 10-2018-7027358, with English Translation. (12 pages).
Office Action dated Mar. 30, 2020, issued in counterpart CN Application No. 201780016862.5, with English Translation. (15 pages).
Office Action dated Jul. 17, 2020, issued in counterpart TW Application No. 106109673, with English translation (10 pages).
Office Action dated Jun. 4, 2019, issued in counterpart JP application No. 2016-063498, with English translation. (13 pages).
Office Action dated Dec. 24, 2019, issued in counterpart JP application No. 2016-063498, with English translation. (16 pages).
Office Action dated Oct. 26, 2020, issued in counterpart TW Application No. 106109673, with English translation. (7 pages).
Office Action dated Sep. 6, 2020, issued in counterpart KR Application No. 10-2016-7027358. (3 pages).
International Search Report dated Jun. 20, 2017, issued in counterpart application No. PCT/JP2017/010973 (2 pages).

* cited by examiner

POLARIZING FILM, PRESSURE-SENSITIVE-ADHESIVE-LAYER-ATTACHED POLARIZING FILM, METHOD FOR PRODUCING POLARIZING FILM, AND IMAGE DISPLAY DEVICE

TECHNICAL FIELD

The invention relates to a polarizing film including a polarizer and a transparent resin layer provided on at least one surface of the polarizer and to a pressure-sensitive-adhesive-layer-attached polarizing film including the polarizing film and a pressure-sensitive-adhesive layer. The polarizing film and the pressure-sensitive-adhesive-layer-attached polarizing film may be used alone or as a component of a laminated optical film to form an image display device such as a liquid crystal display (LCD) or an organic electroluminescent (EL) display. The invention also relates to a method for producing the polarizing film and an image display device including the polarizing film and/or the pressure-sensitive-adhesive-layer-attached polarizing film.

BACKGROUND ART

The image forming system of liquid crystal display devices has polarizing films placed as essential components on both sides of glass substrates that form the liquid crystal panel surfaces. A polarizing film generally used includes a polarizer and a protective film or films bonded to one or both surfaces of the polarizer with an adhesive or the like, in which the polarizer includes a polyvinyl alcohol-based film and a dichroic material such as iodine.

As the polarizing film, known is, for example, a polarizing plate yielded by applying a water-based adhesive containing an acrylic resin emulsion onto at least one surface of a polarizer to form an adhesive layer, and then bonding the polarizer and a retardation film to each other (see, for example, Patent Document 1). As an adhesive used to bond a polarizer and a protective film to each other, an adhesive is known which is made of an aqueous emulsion composition having a specified composition (see, for example, Patent Document 2).

In general, a pressure-sensitive-adhesive is used to bond such a polarizing film to a liquid crystal cell or any other component. The pressure-sensitive-adhesive is provided as a pressure-sensitive-adhesive layer in advance on one surface of the polarizing film because such a pressure-sensitive-adhesive layer has advantages such as the ability to instantly fix the polarizing film and no need to perform a drying step for fixing the polarizing film. Thus, a pressure-sensitive-adhesive-layer-attached polarizing film is generally used when a polarizing film is bonded. As a pressure-sensitive-adhesive layer of such a pressure-sensitive-adhesive-layer-attached polarizing film, acryl-based pressure-sensitive-adhesive layers having various compositions are known (see, for example, Patent Document 3).

In the meantime, polarizing films and pressure-sensitive-adhesive-layer-attached polarizing films have a problem in that in a harsh environment accompanied by thermal shock (e.g., a heat shock test in which −30° C. and 80° C. temperature conditions are repeated, or a test at a high temperature of 100° C.), the polarizer undergoes changes in shrinkage stress, so that cracks (through cracks) can easily occur entirely in the direction of the absorption axis of the polarizer. In other words, pressure-sensitive-adhesive-layer-attached polarizing films have insufficient durability to thermal shock in the harsh environment mentioned above. For thickness reduction, a pressure-sensitive-adhesive-layer-attached polarizing film can be produced using a single-side-protected polarizing film including a polarizer and a transparent protective film provided on only one surface of the polarizer. Particularly, such a pressure-sensitive-adhesive-layer-attached polarizing film has insufficient durability to the thermal shock mentioned above. In addition, the thermal shock-induced through cracks become more likely to occur as the size of the polarizing film increases.

In order to suppress the occurrence of the through cracks, for example, it is proposed to provide a pressure-sensitive-adhesive-layer-attached polarizing film including a single-side-protected polarizing film, a protective layer provided on the polarizing film and having a tensile elastic modulus of 100 MPa or more, and a pressure-sensitive-adhesive layer provided on the protective layer (For example, see Patent Document 4). It is also proposed to provide a pressure-sensitive-adhesive-layer-attached polarizing film including a polarizer with a thickness of 25 μm or less, a protective layer provided on one surface of the polarizer and including a product obtained by curing a curable resin composition, a transparent protective film provided on the other surface of the polarizer, and a pressure-sensitive-adhesive layer provided on the outer side of the protective layer (For example, see Patent Document 5). However, the pressure-sensitive-adhesive-layer-attached polarizing films described in Patent Documents 4 and 5 are insufficient in being made thinner.

In the meantime, in recent years, it has also been investigated that polarizers themselves are made thinner. Thus, many polarizers each having a film thickness of 10 μm or less have been developed (see, for example, Patent Document 6).

PRIOR ART DOCUMENTS

Patent Documents

Patent Document 1: JP-A-2008-261914
Patent Document 2: JP-A-2005-344022
Patent Document 3: JP-A-2005-206689
Patent Document 4: JP-A-2010-009027
Patent Document 5: JP-A-2013-160775
Patent Document 6: JP-B1-4751481

SUMMARY OF THE INVENTION

Problems to be Solved by the Invention

A thin polarizer as described Patent Document 6 can make a polarizing film itself thinner and additionally become small in shrinkage stress change, so that the occurrence of through cracks therein can be restrained. However, it has been understood that in the case of making a polarizer thin, the polarizer undergoes a partial occurrence of very slender slits (hereinafter sometimes referred to as nano-slits) in an absorption axis direction of the polarizer when a mechanical load is applied to a polarizing film using this thin polarizer, or a pressure-sensitive-adhesive-layer-attached polarizing film using this polarizing film.

Such defects, such as nano-slits, would be able to be suppressed by forming a coat layer onto the thin polarizer. However, it has been understood that in accordance with the species of the coat layer, the polarizing film may be remarkably lowered in optical properties in a heating and humidifying test. Specifically, when the coat layer is made of, for example, an ultraviolet curable acrylic resin or water-soluble resin, the polarizing film is remarkably lowered in optical properties in a heating and humidifying test.

Thus, an object of the present invention is to provide a polarizing film using a thin-polarizer, which can suppress the occurrence of defects such as nano-slits and is further restrained from being lowered in optical properties in a heating and humidifying test to have a high optical reliability. Another object of the invention is to provide a pressure-sensitive-adhesive-layer-attached polarizing film having the polarizing film described just above and a pressure-sensitive-adhesive layer.

Still another object of the present invention is to provide a process for producing the polarizing film, and an image display device having the polarizing film or the pressure-sensitive-adhesive-layer-attached polarizing film.

Means for Solving the Problems

As a result of intensive studies, the inventors have accomplished the invention based on findings that the problems can be solved by the polarizing film, the pressure-sensitive-adhesive-layer-attached polarizing film, and other means described below.

That is, the present invention relates to a polarizing film, comprising a polarizer having a thickness of 10 µm or less, and a transparent resin layer on at least one surface of the polarizer, wherein the polarizer comprises a polyvinyl alcohol-based resin, and is designed to have a single-body transmittance T and a polarization degree P representing optical properties satisfying the condition of the following formula:

$$P > -(10^{0.929T-42.4}-1) \times 100 \text{(provided that } T<42.3\text{) or}$$
$$P \geq 99.9 \text{(provided that } T \geq 42.3\text{), and}$$

the transparent resin layer is a formed product of a transparent resin layer forming material comprising a water-based emulsion resin and has a hardness of 0.01 GPa or more.

In the polarizing film of the present invention, the transparent resin layer preferably has an indentation load of 1 to 60 µN, and the indentation load is measured by a nano-indentation method.

The polarizing film of the invention preferably comprises a relaxation layer in which an alignment of a polyvinyl alcohol-based resin is partially relaxed on a side of the polarizer on which the transparent resin layer is formed.

In the polarizing film of the invention, the relaxation layer preferably has a thickness of ⅔ or less of the film thickness of the polarizer.

In the polarizing film of the invention, a/the thickness of the relaxation layer is preferably 0.1 µm or more.

In the polarizing film of the invention, the transparent resin layer is preferably a layer showing no pressure-sensitive adhesion properties.

The polarizing film of the invention preferably further comprises a protective film.

The present invention also relates to a process for producing the polarizing film of the invention comprising:

a step of applying a transparent resin layer forming material comprising a water-based emulsion resin directly onto at least one surface of a polarizer having a thickness of 10 µm or less, and a step of drying the coating layer of the transparent resin layer forming material to form a transparent resin layer having a thickness of 0.1 µm or more.

The present invention also relates to a pressure-sensitive-adhesive-layer-attached polarizing film, comprising the polarizing film of the invention, and further comprising a pressure-sensitive-adhesive layer on a transparent-resin-layer-side of the polarizing film.

The present invention further relates to an image display device, comprising the polarizing film of the invention, or the pressure-sensitive-adhesive-layer-attached polarizing film of the invention.

Effect of the Invention

The polarizing film and the pressure-sensitive-adhesive-layer-attached polarizing film of the present invention each make use of a polarizer having a thickness of 10 µm or less to be made thin. Moreover, the polarizing film and the pressure-sensitive-adhesive-layer-attached polarizing film of the invention each have a specified transparent resin layer on at least one surface of the polarizer, so that these films can suppress the occurrence of defects such as nano-slits and are further restrained from being lowered in optical properties in a heating and humidifying test to have a high optical reliability.

MODE FOR CARRYING OUT THE INVENTION

1. Polarizing Film

The polarizing film of the present invention includes a polarizer having a thickness of 10 µm or less, and a transparent resin layer on at least one surface of the polarizer, in which the polarizer includes a polyvinyl alcohol-based resin, and is designed to have a single-body transmittance T and a polarization degree P representing optical properties satisfying the condition of the following formula:

$$P > -(10^{0.929T-42.4}-1) \times 100 \text{(provided that } T<42.3\text{) or}$$
$$P \geq 99.9 \text{(provided that } T \geq 42.3\text{), and}$$

the transparent resin layer is a formed product of a transparent resin layer forming material including a water-based emulsion resin and has a hardness of 0.01 GPa or more.

Figure 1A:
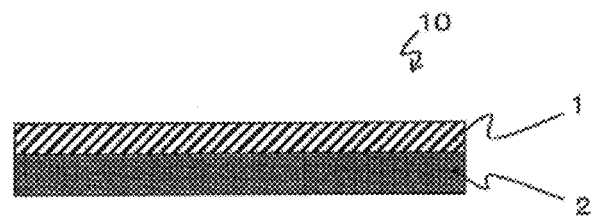
FIG. 1(a) is an example of a schematic cross-sectional view of the polarizing film of the invention, and 1(b) is an example of a schematic cross-sectional view of the polarizing film of the invention.
Figure 1B:
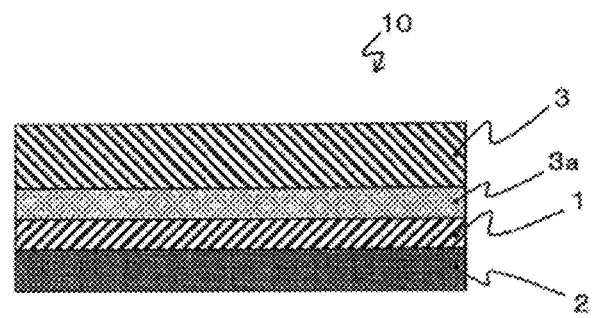
Figure 2:
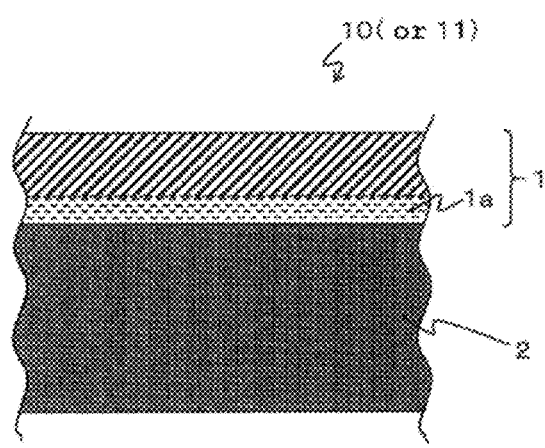
FIG. 2 is an example of a schematic sectional view of an interfacial portion between polarizer and a transparent resin layer of a polarizing film of the present invention.

Referring to FIGS. 1(a), 1(b), and 2, the polarizing film of the present invention will be described. However, the invention is not limited into these figures.

As illustrated in FIG. 1(a), in a polarizing film 10 of the present invention, a transparent resin layer 2 is laid directly onto at least one surface of a polarizer 1. As illustrated in FIG. 1(*b*), a polarizer 1 may have, on a surface thereof that does not have a transparent resin layer 2, a protective film 3. The polarizer 1 and the protective film 3 may be laminated to each other to interpose, therebetween, an adhesive layer 3*a* (and other intervening layers such as a pressure-sensitive-adhesive layer, and an undercoat layer (primer layer)). When the polarizing film 10 has the protective film 3, it is allowable to lay an adhesion-facilitating layer onto the protective film 3, or applying activating treatment to this film to laminate the adhesion-facilitating layer and the adhesive layer to each other although this situation is not illustrated. It is allowable to lay plural protective films 3, or laminate a protective film to the protective film 3 in FIG. 1(*b*) to interpose, therebetween, another adhesive layer (and other intervening layers such as a pressure-sensitive-adhesive layer, and an undercoat layer (primer layer)).

As illustrated in FIG. 2, a polarizing film 10 of the present invention preferably has a relaxation layer 1*a* in which the alignment of a polyvinyl alcohol-based resin is partially relaxed (that is, in which polarization is partially relaxed) on a side of a polarizer 1 as described above in which a transparent resin layer 2 is formed. The presence of the relaxation layer 1*a* in the polarizer 1 favorably allows to make adhesion between the polarizer 1 and the transparent resin layer 2 good. The relaxation layer 1*a* is a layer which is present in the polarizer 1 and is different in refractive index. The relaxation layer can be observed from the transparent resin layer 2 side of the polarizing film, using an optical interference film thickness meter (according to the peak valley method). The relaxation layer 1*a* would be formed by a phenomenon that water in a transparent resin layer forming material, which is a forming material for the transparent resin layer 2, permeates the inside of the polarizer 1 from a surface thereof so that the alignment of the polyvinyl alcohol-based resin in the transparent-resin-layer-2-side surface of the polarizer 1 is partially relaxed (in other words, the polarization of the polarizer is partially relaxed).

The surface of the polarizer 1 has hydrophilic groups such as hydroxyl groups to tend to be hydrophilic. Moreover, a very slight quantity of hydrophilic components is present in outermost surfaces of particles of the water-based emulsion resin which constitutes the transparent resin layer forming material. Accordingly, the use of such a transparent resin layer forming material containing a water-based emulsion resin would improve the adhesion of the transparent resin layer to the surface of the polarizer 1. Furthermore, by applying the transparent resin layer forming material containing the water-based emulsion resin directly onto the surface of the polarizer 1, the vicinity of the surface of the polarizer 1 is swollen by water in the transparent resin layer forming material, so that the regularity of a forming material for the polarizer is disturbed (in other words, the alignment of the polyvinyl alcohol-based resin is disturbed) to relieve the polarization of the polarizing film. At this time, the alignment of hydroxyl groups and other hydrophilic groups which the polarizer 1 surface has is also disturbed. This matter would enhance the contact angle of the transparent resin layer forming material with the hydrophilic components to exhibit adhering strength in a step of drying the workpiece.

The thickness of the relaxation layer 1*a* is not particularly limited, and is preferably ⅔ or less of the film thickness of the polarizer 1 from the viewpoint of optical properties of the resultant polarizing film. The thickness is more preferably ⅓ or less of the film thickness of the polarizer 1.

As described above, the thickness of the relaxation layer 1*a* depends on the film thickness of the polarizer 1. However, from the viewpoint of the adhesion thereof to the transparent resin layer 2, the thickness is preferably 0.1 µm or more, more preferably 0.2 µm or more, in particular preferably 0.3 µm or more. When the thickness of the relaxation layer 1*a* is in any one of these ranges, the adhesion between the polarizer 1 and the transparent resin layer 2 favorably becomes good.

Hereinafter, each of the constituents of the polarizing film 10 will be described.

(1) Polarizer

In the invention, the polarizer 1 used has a thickness of 10 µm or less. In order to reduce the thickness, the thickness of the polarizer 1 is preferably 8 µm or less, more preferably 7 µm or less, even more preferably 6 µm or less. On the other hand, the thickness of the polarizer 1 is preferably, but not limited to, 2 µm or more, more preferably 3 µm or more. The polarizer 1 with such a small thickness is less uneven in thickness, has good visibility, and is less dimensionally-variable and thus has high durability to thermal shock.

The polarizer 1 used includes a polyvinyl alcohol-based resin. For example, the polarizer 1 may be a product produced by a process including adsorbing a dichroic material such as iodine or a dichroic dye to a hydrophilic polymer film such as a polyvinyl alcohol-based film, a partially-formalized polyvinyl alcohol-based film, or a partially-saponified, ethylene-vinyl acetate copolymer-based film and uniaxially stretching the film, or may be a polyene-based oriented film such as a film of a dehydration product of polyvinyl alcohol or a dehydrochlorination product of polyvinyl chloride. Among these polarizers, a polarizer including a polyvinyl alcohol-based film and a dichroic material such as iodine is preferred.

For example, a polarizer including a uniaxially-stretched polyvinyl alcohol-based film dyed with iodine can be produced by a process including immersing a polyvinyl alcohol film in an aqueous iodine solution to dye the film and stretching the film to 3 to 7 times the original length. If necessary, the film may also be immersed in an aqueous solution of potassium iodide or the like optionally containing boric acid, zinc sulfate, zinc chloride, or other materials. If necessary, the polyvinyl alcohol-based film may be further immersed in water for washing before it is dyed. If the polyvinyl alcohol-based film is washed with water, dirt and any anti-blocking agent can be cleaned from the surface of the polyvinyl alcohol-based film, and the polyvinyl alcohol-based film can also be allowed to swell so that unevenness such as uneven dyeing can be effectively prevented. The film may be stretched before, while, or after it is dyed with iodine. The film may also be stretched in an aqueous solution of boric acid, potassium iodide, or the like or in a water bath.

In view of stretching stability and optical durability, the polarizer preferably contains boric acid. In order to suppress the occurrence and expansion of defects such as nano-slits or the like, the content of boric acid in the polarizer is preferably 25% by weight or less, more preferably 20% by weight or less, even more preferably 18% by weight or less, further more preferably 16% by weight or less, based on the total weight of the polarizer. On the other hand, in view of the stretching stability and optical durability of the polarizer, the content of boric acid is preferably 10% by weight or more, more preferably 12% by weight or more, based on the total weight of the polarizer.

Typical examples of the thin polarizer having a thickness of 10 µm or less used in the invention, include the polarizers described in, for example, JP-B1-4751486, JP-B1-4751481, JP-B1-4815544, JP-B1-5048120, JP-B1-5587517, WO 2014/077599 A, and WO 2014/077636 A or the polarizers obtained by the production methods described in these publications.

The polarizer is designed to have a single-body transmittance T and a polarization degree P that represent optical properties satisfying the condition of the following formula:

$$P > -(10^{0.929T-42.4}-1) \times 100 \text{(provided that } T<42.3\text{) or}$$

P≥99.9 (provided that T≥42.3). The polarizer designed to satisfy the condition uniquely has the performance required for a liquid crystal television display having a large display element. Specifically, such a display is required to have a contrast ratio of 1,000:1 or more and a maximum brightness of 500 cd/m² or more. In other applications, for example, the polarizer is bonded to the viewer side of an organic EL display device.

On the other hand, the polarizer designed to satisfy the condition includes a polymer (e.g., a polyvinyl alcohol-based molecule) having high orientation, which causes, together with the thickness of 10 μm or less, a significant reduction in the tensile rupture stress in the direction perpendicular to the absorption axis direction of the polarizer. This extremely increases the possibility that nano-slits may occur in the direction of the absorption axis of the polarizer, for example, when the polarizer is exposed to mechanical shock beyond the tensile rupture stress in the process of producing the polarizing film. Therefore, the invention is particularly suitable for providing a polarizing film including the polarizer described above (or providing a pressure-sensitive-adhesive-layer-attached polarizing film including the polarizer described above).

The polarizer described above should be produced by a process capable of achieving high-ratio stretching to improve polarizing performance, among processes including the steps of stretching and dyeing a laminate. From this point of view, the thin polarizer is preferably obtained by a process including the step of stretching in an aqueous boric acid solution as described in JP-B1-4751486, JP-B1-4751481, or JP-B1-4815544, and more preferably obtained by a process including the step of performing auxiliary in-air stretching before stretching in an aqueous boric acid solution as described in JP-B1-4751481 or JP-B1-4815544. These polarizers can be obtained by a process including the steps of stretching a laminate of a polyvinyl alcohol-based resin (hereinafter also referred to as PVA-based resin) layer and a stretchable resin substrate and dyeing the laminate. Using this process, the PVA-based resin layer, even when thin, can be stretched without problems such as breakage by stretching, because the layer is supported on the stretchable resin substrate.

As described above, the polarizer 1 in the polarizing film 10 of the present invention preferably has the relaxation layer 1a, in which the alignment of the polyvinyl alcohol-based resin is partially relaxed (that is, in which polarization is partially relaxed). The relaxation layer 1a is as described above.

(2) Transparent Resin Layer

The transparent resin layer 2 is a layer laid on a surface of at least one of both sides of the polarizer 1, and may be laid on each of both the surfaces of the polarizer 1.

The hardness of the transparent resin layer 2 used in the present invention is 0.01 GPa or more, preferably 0.02 GPa or more, more preferably 0.05 GPa or more. When the hardness of the transparent resin layer 2 is 0.01 GPa or more, the occurrence of nano-slits can be prevented. The upper limit of the hardness of the transparent resin layer 2 is not particularly limited, and is, for example, preferably 5 GPa or less, more preferably 3 GPa or less, even more preferably 1 GPa or less.

Furthermore, the transparent resin layer 2 preferably shows no pressure-sensitive adhesion properties from the viewpoint of the transportability of the polarizing film. This case is preferred since in the case, in which the transparent resin layer 2 shows no pressure-sensitive adhesion properties, when the resultant polarizing film is used to produce a pressure-sensitive-adhesive-layer-attached polarizing film or when, for example, a laminated optical film or image display device that will be detailed later is produced, the polarizing film having the transparent resin layer 2 can be transported using, for example, a transporting roll or be wound into a roll form without forming a protective (temporarily protective) film or the like separately onto the transparent resin layer 2.

Figure 4:
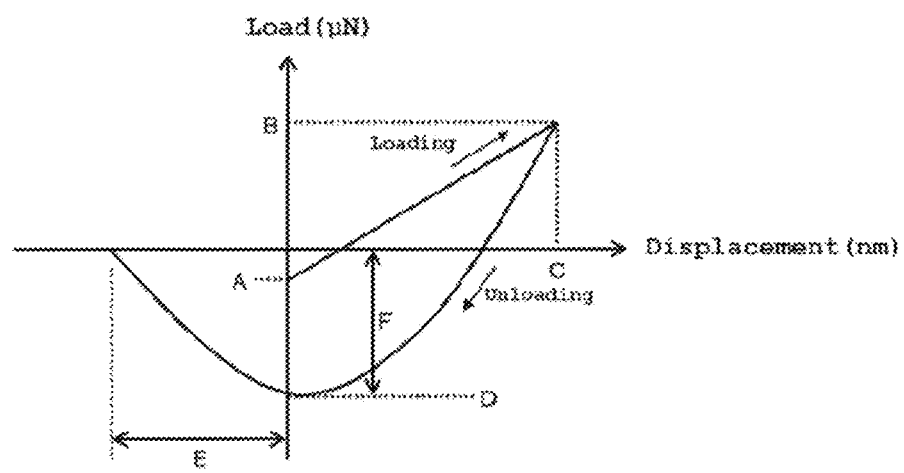
FIG. 4 is a schematic chart referred to for describing a load-displacement curve based on a nano-indentation method.

The wording that the transparent resin layer 2 "shows no pressure-sensitive adhesion properties" denotes that the pressure-sensitive-adhesion index thereof is from about 0 to about −5 μN, the index being measured by a nano-indentation method. The nano-indentation method is a method of pushing a (Berkovich type) diamond indenter of a nano-indenter directly into a surface of a sample (surface of the transparent resin layer 2), and measuring the indentation depth of the indenter in the precision of nanometer order to gain a load-displacement curve of the sample. A load-displacement curve of a sample is shown in FIG. 4. In FIG. 4, A represents a minimum load (μN) in a load curve; B represents a maximum load $P_{max}$ (μN) in the load curve; C represents a maximum displacement (nm) of the sample; D represents a minimum load (μN) in an unload curve; and E represents the displacement quantity (nm) of the sample in the unload curve. In the measurement, the load-displacement curve of the sample is measured at a maximum indentation quantity of 100 nm, and a load/unload speed of 100 nN/s. The pressure-sensitive-adhesion index measured by the nano-indentation method denotes the minimum load (μN) (an arrow F in FIG. 4) in the unload curve of the load-displacement curve. As the pressure-sensitive-adhesive strength of the measured sample is higher, the measured sample is further bonded to the indenter so that the indenter is further pulled. This indenter-pulled strength is the minimum load in the unload curve. As the sample is higher in pressure-sensitive-adhesive strength, the absolute value of the unloading load is larger.

The pressure-sensitive-adhesion index is preferably from 0 to −3.0 μN, more preferably from 0 to −2.5 μN, even more preferably from 0 to −1.0 μN. When the pressure-sensitive-adhesion index is in any one of the ranges, the transparent resin layer 2 has no pressure-sensitive adhesion properties so that the polarizing film is very good in transportability.

The indentation load (μN) of the transparent resin layer 2 that is measured by the nano-indentation method is preferably from 1 to 60 μN to suppress the occurrence of nano-slits. When the indentation load of the transparent resin layer 2 is 1 μN or more, the polarizer 1 favorably tends to be restrainable from being bent at the time of applying an impact to the polarizer 1. When the indentation load is 60 μN or less, the polarizing film favorably tends to be able to absorb impacts. The indentation load is more preferably from 2 to 55 μN, more preferably from 4 to 40 μN, in particular preferably from 5 to 30 μN. The indentation load is a load (μN) required when the indenter is pushed into a transparent resin layer by 100 nm in the measurement by the nano-indentation method, and denotes the maximum load $P_{max}$ (μN) in the load curve in FIG. 4. Conditions for the measurement may be the same as for the measurement of the pressure-sensitive-adhesion index.

The thickness of the transparent resin layer 2 is preferably 0.1 µm or more, more preferably from 0.1 to 15 µm, even more preferably from 0.2 to 12 µm, even more preferably from 0.5 to 5 µm, in particular preferably from 0.8 to 1.5 µm from the viewpoint of the optical reliability of the polarizing film. About a relationship between the thickness Y (µm) of the transparent resin layer 2 and the thickness X (µm) of the polarizer 1, the thickness Y is controlled preferably to satisfy "$0.05 \leq (Y/X) \leq 3$", more preferably to satisfy "$0.14 \leq (Y/X) \leq 3$", even more preferably to satisfy "$0.15 \leq (Y/X) \leq 3$".

The transparent resin layer 2 used in the present invention is a layer made of a transparent resin layer forming material containing a water-based emulsion resin. In other words, the transparent resin layer 2 used in the present invention is a formed product of a transparent resin layer forming material containing a water-based emulsion resin. The water-based emulsion resin means particles of a resin emulsified in water (dispersion medium). The water-based emulsion resin can be gained by emulsion-polymerizing a monomer component in the presence of an emulsifier. The transparent resin layer 2 used in the present invention may be formed by applying a transparent resin layer forming material containing an emulsion containing the water-based emulsion resin directly onto the polarizer 1, and then drying the resultant.

In the present invention, the transparent resin layer forming material, which contains the water-based emulsion, is used to form the transparent resin layer 2, so that the transparent resin layer 2 suppresses the occurrence of defects such as nano-slits; and additionally the transparent resin layer 2 functions also as a barrier film containing a large proportion of hydrophobic components low in hygroscopicity. For these reasons, in the present invention, the polarizing film is made better in optical reliability than in a case where a polarizing film does not have the transparent resin layer 2, and in a case where a transparent resin layer made of a water-soluble resin or the like is formed.

A resin which constitutes the water-based emulsion resin is not particularly limited. Examples thereof include acryl-based resin, silicone-based resin, polyurethane-based resin, and fluorine-contained resin. Thereamong, polyurethane-based resin and acryl-based resin are preferred in the present invention since the resins are excellent in optical transparency, weather resistance, heat resistance and others.

The water-based acrylic emulsion resin is, for example, a (meth)acrylic polymer yielded by emulsion-polymerizing monomer components including, as a main component, an alkyl (meth)acrylate in the presence of an emulsifier. The monomer components preferably include a carboxyl group-containing monomer. In the present invention, the word "(meth)acrylate" means "acrylate" and/or "methacrylate", and the word "(meth)" has substantially the same meaning hereinafter.

The alkyl (meth)acrylate is not particularly limited, but an alkyl (meth)acrylate having a linear, branched, or cyclic alkyl group having 1 to 14 carbon atoms can be exemplified.

Examples of the alkyl (meth)acrylate, for example, include an alkyl acrylate having an alkyl group of 2 to 14 carbon atoms, and an alkyl acrylate having an alkyl group of 4 to 9 carbon atoms is preferable. Specific examples thereof include an alkyl acrylate having a linear or branched alkyl group, such as ethyl acrylate, propyl acrylate, n-butyl acrylate, isobutyl acrylate, s-butyl acrylate, isoamyl acrylate, hexyl acrylate, heptyl acrylate, octyl acrylate, 2-ethylhexyl acrylate, isooctyl acrylate, nonyl acrylate, isononyl acrylate, and the like. Thereamong, ethyl acrylate and n-butyl acrylate are preferred.

Examples of the alkyl (meth)acrylate include an alkyl methacrylate having an alkyl group of 1 to 14 carbon atoms, and an alkyl methacrylate having an alkyl group of 1 to 10 carbon atoms is more preferable. Specific examples thereof include an alkyl methacrylate having a linear or branched alkyl group, such as methyl methacrylate, ethyl methacrylate, propyl methacrylate, isopropyl methacrylate, n-butyl methacrylate, isobutyl methacrylate, s-butyl methacrylate, t-butyl methacrylate and 2-ethylhexyl methacrylate, and an alicyclic alkyl methacrylate, such as cyclohexyl methacrylate, bornyl methacrylate, and isobornyl methacrylate. Thereamong, methyl methacrylate, ethyl methacrylate, and 2-ethylhexyl methacrylate are preferable.

These alkyl (meth)acrylates may be used singly or in any combination of two or more thereof. Among the alkyl (meth)acrylates, alkyl esters of methacrylic acid are preferred from the viewpoint that the esters give hardness to a polymer which forms the transparent resin layer, and the viewpoint of the pressure-sensitive adhesion properties of the resultant transparent resin layer.

In all monomer components which form the water-based emulsion resin, the content of the alkyl (meth)acrylate(s) is preferably from 70 to 100% by weight, more preferably from 85 to 99% by weight, even more preferably from 87 to 99% by weight of all the monomer components (100% by weight). Moreover, from the viewpoint of the pressure-sensitive adhesion of the transparent resin layer, the content of the alkyl ester(s) of methacrylic acid in the monomer components is preferably 30% or more by weight, more preferably from 30 to 70% by weight, even more preferably from 30 to 65% by weight thereof. Furthermore, the content of the alkyl ester (s) of acrylic acid in the monomer components is preferably 70% or less by weight, more preferably from 30 to 70% by weight, even more preferably from 35 to 70% by weight thereof.

Any monomer having a carboxyl group and an unsaturated double bond-containing polymerizable functional group such as a (meth)acryloyl group or a vinyl group may be used without restriction as the carboxyl group-containing monomer. Examples of the carboxyl group-containing monomer include acrylic acid, methacrylic acid, carboxyethyl (meth)acrylate, carboxypentyl (meth)acrylate, itaconic acid, maleic acid, fumaric acid, and crotonic acid. These may be used alone or in any combination. Among these, acrylic acid and methacrylic acid are preferred, and methacrylic acid is particularly preferred.

The carboxyl group-containing monomer is used in a proportion that is preferably 10 parts or less by weight, and in a proportion more preferably from 0.5 to 10 parts by weight, even more preferably from 0.5 to 8 parts by weight, in particular preferably from 1 to 8 parts by weight for 100 parts by weight of the alkyl (meth)acrylate(s) having an alkyl group of 1 to 14 carbon atoms. If the proportion of the carboxyl group-containing monomer is more than 10 parts by weight, the monomer is remarkably lowered in dispersion stability when polymerized, or the water dispersion thereof rises remarkably in viscosity so that the rise unfavorably tends to affect the applying of the dispersion.

Furthermore, for the above-mentioned monomer component(s), a copolymerizable monomer copolymerizable with the alkyl (meth)acrylate(s) may be used as a monomer component besides the alkyl (meth)acrylate(s), and the carboxyl group-containing monomer.

The copolymerizable monomer may be of any type having an unsaturated double bond-containing polymerizable functional group such as a (meth)acryloyl group or a vinyl group, examples of which include alkyl (meth)acrylate having a alkyl group of 15 or more carbon atoms; aryl (meth) acrylate such as phenyl (meth)acrylate; vinyl esters such as vinyl acetate and vinyl propionate; styrene monomers such as styrene; epoxy group-containing monomers such as glycidyl (meth)acrylate and methylglycidyl (meth)acrylate; hydroxyl group-containing monomers such as 2-hydroxyethyl acrylate and 2-hydroxypropyl acrylate; nitrogen atom-containing monomers such as (meth)acrylamide, N,N-dimethyl(meth)acrylamide, N,N-diethyl(meth)acrylamide, N-isopropyl(meth)acrylamide, N-butyl(meth)acrylamide, N-methylol(meth)acrylamide, N-methylolpropane(meth) acrylamide, (meth)acryloylmorpholine, aminoethyl (meth) acrylate, N,N-dimethylaminoethyl (meth)acrylate, and tert-butylaminoethyl (meth)acrylate; alkoxy group-containing monomers such as methoxyethyl (meth)acrylate and ethoxyethyl (meth)acrylate; cyano group-containing monomers such as acrylonitrile and methacrylonitrile; functional monomers such as 2-methacryloyloxyethyl isocyanate; olefin monomers such as ethylene, propylene, isoprene, butadiene, and isobutylene; vinyl ether monomers such as vinyl ether; halogen atom-containing monomers such as vinyl chloride; and other monomers including vinyl group-containing heterocyclic compounds such as N-vinylpyrrolidone, N-(1-methylvinyl)pyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, and N-vinylmorpholine, and N-vinylcarboxylic acid amides.

Examples of the copolymerizable monomer also include maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylene-succinimide, N-(meth)acryloyl-6-oxyhexamethylenesuccinimide, and N-(meth)acryloyl-8-oxyoctamethylenesuccinimide; and sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalene-sulfonic acid.

The copolymerizable monomer may be a phosphate group-containing monomer. For example, the phosphate group-containing monomer may be a phosphate group-containing monomer represented by formula (1) below.

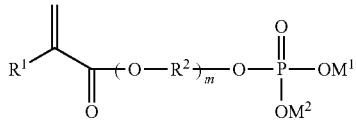

(1)

In formula (1), $R^1$ represents a hydrogen atom or a methyl group, $R^2$ represents an alkylene group of 1 to 4 carbon atoms, m represents an integer of 2 or more, and $M^1$ and $M^2$ each independently represent a hydrogen atom or a cation.

In formula (1), m is an integer of 2 or more, preferably an integer of 4 or more, generally an integer of 40 or less, and m represents the degree of polymerization of the oxyalkylene groups. The polyoxyalkylene group may be a polyoxyethylene group or a polyoxypropylene group, and these polyoxyalkylene groups may include random, block, or graft units. The cation of the salt of the phosphate group is typically, but not limited to, an inorganic cation such as an alkali metal such as sodium or potassium or an alkaline-earth metal such as calcium or magnesium, or an organic cation such as a quaternary amine.

Examples of the copolymerizable monomer include glycol-based acrylic ester monomers such as polyethylene glycol (meth)acrylate, polypropylene glycol (meth)acrylate, methoxyethylene glycol (meth)acrylate, and methoxypolypropylene glycol (meth)acrylate; and acrylic ester-based monomers each having a heterocycle or a halogen atom, such as tetrahydrofurfuryl (meth)acrylate, and fluorine (meth)acrylate.

A polyfunctional monomer may also be used as the copolymerizable monomer for a purpose such as control of the gel fraction of the transparent resin layer forming material. The polyfunctional monomer may be a compound having two or more unsaturated double bonds such as those in (meth)acryloyl groups or vinyl groups. Examples that may also be used include (meth)acrylate esters of polyhydric alcohols, such as (mono or poly)alkylene glycol di(meth) acrylates including (mono or poly)ethylene glycol di(meth) acrylates such as ethylene glycol di(meth)acrylate, diethylene glycol di(meth)acrylate, triethylene glycol di(meth) acrylate, trimethylolpropane tri(meth)acrylate, and tetraethylene glycol di(meth)acrylate, (mono or poly)propylene glycol di(meth)acrylate such as propylene glycol di(meth)acrylate, neopentyl glycol di(meth)acrylate, 1,6-hexanediol di(meth)acrylate, pentaerythritol di(meth)acrylate, trimethylolpropane tri(meth)acrylate, pentaerythritol tri(meth)acrylate, and dipentaerythritol hexa(meth)acrylate; polyfunctional vinyl compounds such as divinylbenzene; and compounds having reactive unsaturated double bond(s), such as allyl (meth)acrylate and vinyl (meth)acrylate. The polyfunctional monomer may also be a compound having a polyester, epoxy or urethane skeleton to which two or more unsaturated double bonds are added in the form of functional groups such as (meth)acryloyl groups or vinyl groups in the same manner as the monomer component, such as polyester (meth)acrylate, epoxy (meth)acrylate, or urethane (meth) acrylate.

The proportion of the copolymerizable monomer other than the carboxyl group-containing monomer is preferably 40 parts or less by weight, more preferably 30 parts or less by weight, even more preferably 20 parts or less by weight, in particular preferably 10 parts or less by weight for 100 parts by weight of the above-mentioned alkyl (meth) acrylate(s), which has/have an alkyl group of 1 to 14 carbon atoms.

The emulsion polymerization of the above-mentioned monomer components can be attained by polymerizing the monomer components in the presence of an emulsifier. This operation allows to prepare a water-based acrylic emulsion containing a dispersed (meth)acrylic polymer. In the emulsion polymerization, together with the above-mentioned monomer components, an emulsifier, a polymerization initiator and optional components, such as a chain transfer agent, are appropriately blended into water. More specifically, each emulsion polymerization stage may be performed, for example, using a known emulsion polymerization method such as a batch mixing method (batch polymerization method), a monomer dropping method, or a monomer emulsion dropping method. In a monomer dropping method, continuous dropping or intermittent dropping is appropriately selected. These methods may be combined as needed. Reaction conditions and other conditions are appropriately selected, in which, for example, the polymerization temperature is preferably from about 20 to about 90° C., and the polymerization time is preferably from about 30 minutes to about 24 hours.

The surfactant (emulsifying agent) for use in the emulsion polymerization may be, but not limited to, any of various surfactants commonly used in emulsion polymerization. As the surfactant, an anionic or a nonionic surfactant is generally used. Examples of the anionic surfactant include higher fatty acid salts such as sodium oleate; alkylarylsulfonate salts such as sodium dodecylbenzenesulfonate; alkylsulfate ester salts such as sodium laurylsulfate and ammonium laurylsulfate; polyoxyethylene alkyl ether sulfate ester salts such as sodium polyoxyethylene lauryl ether sulfate; polyoxyethylene alkyl aryl ether sulfate ester salts such as sodium polyoxyethylene nonyl phenyl ether sulfate; alkyl sulfosuccinic acid ester salts such as sodium monooctyl sulfosuccinate, sodium dioctyl sulfosuccinate, and sodium polyoxyethylene lauryl sulfosuccinate, and derivatives thereof; polyoxyethylene distyrenated phenyl ether sulfate ester salts; and sodium naphthalene sulfonate formaldehyde condensates. Examples of the nonionic surfactant include polyoxyethylene alkyl ethers such as polyoxyethylene lauryl ether and polyoxyethylene stearyl ether; polyoxyethylene alkyl phenyl ethers such as polyoxyethylene octyl phenyl ether and polyoxyethylene nonyl phenyl ether; sorbitan higher fatty acid esters such as sorbitan monolaurate, sorbitan monostearate, and sorbitan trioleate; polyoxyethylene sorbitan higher fatty acid esters such as polyoxyethylene sorbitan monolaurate; polyoxyethylene higher fatty acid esters such as polyoxyethylene monolaurate and polyoxyethylene monostearate; glycerin higher fatty acid esters such as oleic acid monoglyceride and stearic acid monoglyceride; and polyoxyethylene-polyoxypropylene block copolymers, and polyoxyethylene distyrenated phenyl ether.

Besides the above non-reactive surfactants, a reactive surfactant having a radical-polymerizable functional group containing an ethylenic unsaturated double bond may be used as the surfactant. The reactive surfactant may be a radical-polymerizable surfactant prepared by introducing a radical-polymerizable functional group (radically reactive group) such as a propenyl group or an allyl ether group into the anionic surfactant or the nonionic surfactant. These surfactants may be appropriately used alone or in any combination. Among these surfactants, the radical-polymerizable surfactant having a radical-polymerizable functional group is preferably used in view of the stability of the aqueous dispersion or the durability of the pressure-sensitive-adhesive layer.

Examples of anionic reactive surfactants include alkyl ether surfactants (examples of commercially available products include AQUALON KH-05, KH-10, and KH-20 manufactured by Dai-ichi Kogyo Seiyaku Co., Ltd., ADEKA REASOAP SR-10N and SR-20N manufactured by ADEKA CORPORATION, LATEMUL PD-104 manufactured by Kao Corporation, and others); sulfosuccinic acid ester surfactants (examples of commercially available products include LATEMUL S-120, S-120A, S-180P, and S-180A manufactured by Kao Corporation and ELEMINOL JS-2 manufactured by Sanyo Chemical Industries, Ltd., and others); alkyl phenyl ether surfactants or alkyl phenyl ester surfactants (examples of commercially available products include AQUALON H-2855A, H-3855B, H-3855C, H-3856, HS-05, HS-10, HS-20, HS-30, BC-05, BC-10, and BC-20 manufactured by Dai-ichi Kogyo Seiyaku Co., Ltd., and ADEKA REASOAP SDX-222, SDX-223, SDX-232, SDX-233, SDX-259, SE-10N, and SE-20N manufactured by ADEKA CORPORATION); (meth)acrylate sulfate ester surfactants (examples of commercially available products include ANTOX MS-60 and MS-2N manufactured by Nippon Nyukazai Co., Ltd., ELEMINOL RS-30 manufactured by Sanyo Chemical Industries Co., Ltd., and others); and phosphoric acid ester surfactants (examples of commercially available products include H-3330PL manufactured by Dai-ichi Kogyo Seiyaku Co., Ltd., ADEKA REASOAP PP-70 manufactured by ADEKA CORPORATION, and others). Examples of nonionic reactive surfactants include alkyl ether surfactants (examples of commercially available products include ADEKA REASOAP ER-10, ER-20, ER-30, and ER-40 manufactured by ADEKA CORPORATION, LATEMUL PD-420, PD-430, and PD-450 manufactured by Kao Corporation, and others); alkyl phenyl ether surfactants or alkyl phenyl ester surfactants (examples of commercially available products include AQUALON RN-10, RN-20, RN-30, and RN-50 manufactured by Dai-ichi Kogyo Seiyaku Co., Ltd., ADEKA REASOAP NE-10, NE-20, NE-30, and NE-40 manufactured by ADEKA CORPORATION, and others); and (meth)acrylate sulfate ester surfactants (examples of commercially available products include RMA-564, RMA-568, and RMA-1114 manufactured by Nippon Nyukazai Co., Ltd., and others).

The surfactant is preferably added in an amount of 0.3 to 5 parts by weight, more preferably 0.3 to 4 parts by weight, to 100 parts by weight of the monomer component. The addition of the surfactant in such an amount can improve polymerization stability or mechanical stability.

The radical polymerization initiator may be, but not limited to, any known radical polymerization initiator commonly used in emulsion polymerization. Examples include azo initiators such as 2,2'-azobisisobutylonitrile, 2,2'-azobis(2-methylpropionamidine)disulfate, 2,2'-azobis(2-methylpropionamidine)dihydrochloride, 2,2'-azobis(2-amidinopropane)dihydrochloride, and 2,2'-azobis[2-(2-imidazoline-2-yl)propane]dihydrochloride; persulfate initiators such as potassium persulfate and ammonium persulfate; peroxide initiators such as benzoyl peroxide, tert-butyl hydroperoxide, and hydrogen peroxide; substituted ethane initiators such as phenyl-substituted ethane; and carbonyl initiators such as aromatic carbonyl compounds. These polymerization initiators may be appropriately used alone or in any combination. If desired, the emulsion polymerization may be performed using a redox system initiator, in which a reducing agent is used in combination with the polymerization initiator. This makes it easy to accelerate the emulsion polymerization rate or to perform the emulsion polymerization at low temperature. Examples of such a reducing agent include reducing organic compounds such as ascorbic acid, erythorbic acid, tartaric acid, citric acid, glucose, and metal salts of formaldehyde sulfoxylate or the like; reducing inorganic compounds such as sodium thiosulfate, sodium sulfite, sodium bisulfite, and sodium metabisulfite; and ferrous chloride, Rongalite, and thiourea dioxide.

The content of the radical polymerization initiator is typically from about 0.02 to about 1 part by weight, preferably from 0.02 to 0.5 parts by weight, more preferably from 0.05 to 0.3 parts by weight, based on 100 parts by weight of the monomer components, while it is appropriately selected. If it is less than 0.02 parts by weight, the radical polymerization initiator may be less effective. If it is more than 1 part by weight, the (meth)acryl-based polymer of the transparent resin layer forming material may have a reduced molecular weight, so that the transparent resin layer forming material may have reduced durability. In the case of a redox system initiator, the reducing agent is preferably used in an amount of 0.01 to 1 part by weight based on 100 parts by weight of the total amount of the monomer components.

If necessary, the chain transfer agent is used to control the molecular weight of (meth)acryl-based polymer. Any chain transfer agent commonly used in emulsion polymerization may be used as needed. Examples include 1-dodecanthiol, mercaptoacetic acid, 2-mercaptoethanol, 2-ethylhexyl thioglycolate, 2,3-dimercapto-1-propanol, mercaptopropionic acid esters, and other mercaptans. These chain transfer agents may be appropriately used alone or in any combination. For example, the content of the chain transfer agent is 0.3 parts by weight or less, preferably from 0.001 to 0.3 parts by weight, based on 100 parts by weight of the monomer components.

Such an emulsion polymerization allows to prepare an emulsion containing (meth)acrylic polymer particles (as emulsion particles). About such an emulsion-type (meth)acrylic polymer, the average particle diameter thereof is adjusted into a range preferably from about 0.05 to about 3 μm, more preferably from 0.05 to 1 μm. If the average particle diameter is less than 0.05 μm, the transparent resin layer forming material may rise in viscosity. If the diameter is more than 1 μm, the particles may be lowered in melt-bondability therebetween to be lowered in cohesive force.

When the (meth)acrylic polymer related to the emulsion contains, as a copolymerizable monomer, the carboxyl group-containing monomer or the like in order to keep the dispersion stability of the emulsion, it is preferred to neutralize the carboxyl group-containing monomer or the like. The neutralization can be attained with, for example, ammonia or a hydroxide of an alkali metal.

About the (meth)acrylic polymer, which is the water-based emulsion resin in the present invention, the weight-average molecular weight thereof is usually preferably 100000 or more, more preferably from 100000 to 4000000 from the viewpoint of the heat resistance and the humidity resistance of the resultant. However, a pressure-sensitive-adhesive agent yielded by emulsion polymerization generally contains a large proportion of a gel fraction, so that the molecular weight thereof cannot be measured by GPC (gel permeation chromatography). Thus, it is difficult in many cases that the molecular weight is supported by any actual measurement about the molecular weight.

About the (meth)acrylic polymer, which is the water-based emulsion resin in the present invention, the glass transition temperature (Tg) thereof is not particularly limited, and is preferably from 0 to 120° C., more preferably from 10 to 80° C. It is favorable for the heat resistance of the polarizing plate that the glass transition temperature (Tg) of the (meth)acrylic polymer is in any one of these ranges.

A polyurethane resin usable as the water-based emulsion resin may be a polyurethane resin or a urethane prepolymer. The polyurethane resin is a polyurethane yielded from a polyol component and a polyisocyanate component as main components, or a modified product thereof. The urethane prepolymer is generally made from a polyol component and a polyisocyanate component as main components, and has, at a terminal thereof, an isocyanate group or a blocked isocyanate group.

Examples of the polyol component includes ethylene oxide, propylene oxide, polyethylene glycol yielded by ring-opening polymerization of, for example, tetrahydrofuran, polypropylene glycol, polyoxytetramethylene ether glycol, and other polyether polyols; ethylene glycol, diethylene glycol, triethylene glycol, 1,2-propanediol, 1,3-propanediol, 1,3-butanediol, 1,4-butanediol, neopentyl glycol, pentanediol, 3-methyl-1,5-pentanediol, 1,6-hexanediol, octanediol, 1,4-butynediol, dipropylene glycol, bisphenol A, bisphenol A propylene oxide adducts, bisphenol A ethylene oxide adducts, hydrogenated bisphenol A, and various known saturated and unsaturated low-molecular glycols; polyester polyols each obtained by dehydration-condensing any one of the low-molecular glycols, and a dibasic acid such as adipic acid, maleic acid, fumaric acid, phthalic anhydride, isophthalic acid, terephthalic acid, succinic acid, oxalic acid, malonic acid, glutaric acid, pimelic acid, azelaic acid, sebacic acid or suberic acid, or an acid anhydride corresponding to any one of these acids; polyester polyols each obtained by ring-opening polymerization of a lactone, such as ε-caprolactone or β-methyl-δ-valerolactone; and other polycarbonate polyols, polybutadiene glycols, and other various known polymer polyols used generally in the production of polyurethane. A partial fraction of each of the above-mentioned low-molecular glycols may be changed to a polyol that may be of various types, such as glycerine, trimethylolpropane, trimethylolethane, 1,2,6-hexanetriol, 1,2,4-butanetriol, pentaerythritol, or sorbitol.

The polyisocyanate compound may be a known diisocyanate that may be of various types, for example, an aromatic, aliphatic or alicyclic diisocyanate. Typical examples thereof include 1,5-naphthylene diisocyanate, 4,4'-diphenylmethane diisocyanate, 4,4'-diphenyldimethylmethane diisocyanate, 4,4'-dibenzyl isocyanate, dialkyldiphenylmethane diisocyanate, tetraalkyldiphenylmethane diisocyanate, 1,3-phenylene diisocyanate, 1,4-phenylene diisocyanate, tolylene diisocyanate, butane-1,4-diisocyanate, hexamethylene diisocyanate, isopropylene diisocyanate, methylene diisocyanate, 2,2,4-trimethylhexamethylene diisocyanate, 2,4,4-trimethylhexamethylene diisocyanate, cyclohexane-1,4-diisocyanate, xylylene diisocyanate, isophorone diisocyanate, lysine diisocyanate, dicyclohexylmethane-4,4'-diisocyanate, 1,3-bis(isocyanatomethyl)cyclohexane, methylcyclohexane diisocyanate, m-tetramethylxylylene diisocyanate, and any dimer diisocyanate yielded by converting carboxyl groups of a dimer acid to isocyanate groups.

Examples of a blocking agent for the isocyanate group include phenols, alcohols, lactams, oximes, and active methylene compounds each containing a bisulfite or a sulfonate group.

In the present invention, the polyurethane resin is usable as the water-based emulsion resin. The water dispersibility or water solubility of the polyurethane resin can be attained, for example, by introducing hydrophilic group such as carboxyl groups into a polyurethane resin or urethane prepolymer, or by using a polyol component having a hydrophilic moiety, such as an ethylene oxide adduct.

Examples of the water-based polyurethane resin include products SUPERFLEX 150, 820, and 870 manufactured by Dai-ichi Kogyo Seiyaku Co., Ltd.

The water-based emulsion coating liquid used in the present invention may contain a film-forming aid. The film-forming aid is not limited, and is, for example, a glycol ether solvent represented by the following general formula (2):

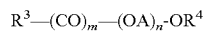

$$R^3-(CO)_m-(OA)_n-OR^4$$

wherein $R^3$ is a hydrogen atom or a hydrocarbon group having 1 to 10 carbon atoms, $R^4$ is a hydrocarbon group having 1 to 10 carbon atoms, A is an alkylene group having 2 or 3 carbon atoms, n is an integer of 1 to 60, and m=0 or 1 provided that a case where $R^3$ is a hydrogen atom and m=1 is excluded. Examples of the hydrocarbon group according to the groups $R^3$ and $R^4$, which has 1 to 10 carbon atoms, include linear, branched, and cyclic alkyl groups and alkenyl groups; aromatic groups; and any combination of two or more of these groups. OA is an oxyethylene group or oxypropylene group, and these groups may be mixed with each other to turn to a random body or block body. Specific examples of the glycol ether solvent represented by the general formula (2) include diethylene glycol monobutyl ether acetate, polypropylene glycol monomethyl ether, polyethylene glycol monophenyl ether, triethylamine, and texanol.

The blend proportion of the film-forming aid is preferably from 0.1 to 15 parts by weight, preferably from 0.5 to 10 parts by weight for 100 parts by weight of (solid basis) the water-based emulsion resin.

The transparent resin layer forming material containing the water-based emulsion resin used in the present invention can be yielded, for example, by mixing the film-forming aid with a water dispersion related to the above-mentioned water dispersion type acrylic resin.

The solid concentration in the transparent resin layer forming material used in the present invention is preferably 10% or more, more preferably 30% or more by weight.

In the transparent resin layer forming material used in the present invention, various additives may be optionally and appropriately used as far as a departure from the object of the present invention is not made. Examples of the additives include crosslinking agents, viscosity modifiers, peel adjusting agents, plasticizers, softening agents, glass fibers, glass beads, metal powders, fillers each made of an inorganic powder, pigments, colorants (such as pigments and dyes), pH adjusting agents (acids or bases), antioxidants, ultraviolet absorbers, and silane coupling agents. These additives may also be blended in the form of an emulsion.

The method for forming the transparent resin layer 2 in the present invention will be as described later.

(3) Protective Film

The polarizing film 10 of the present invention may have the protective film 3. Specifically, when the polarizer 1 has, on at least one surface thereof, the transparent resin layer 2, the protective film 3 may be laminated, as has been illustrated in FIG. 1(b), to a surface of the polarizer 1 on which the transparent resin layer 2 is not formed to interpose, therebetween, the adhesive layer 3a (and other intervening layers such as a pressure-sensitive-adhesive layer, and an undercoat layer (primer layer)). Moreover, when the polarizer 1 has, on both surfaces thereof, the transparent resin layers 2, respectively, the polarizing film of the present invention may have a protective film or protective films on either or both of the transparent resin layers 2.

The protective film is preferably made of a material having a high level of transparency, mechanical strength, thermal stability, water barrier properties, isotropy, and other properties. Examples of such a material include polyester-based polymers such as polyethylene terephthalate and polyethylene naphthalate, cellulose-based polymers such as diacetyl cellulose and triacetyl cellulose, acryl-based polymers such as polymethyl methacrylate, styrene-based polymers such as polystyrene and acrylonitrile-styrene copolymers (AS resins), and polycarbonate-based polymers. Examples of polymers that may be used to form the protective film also include polyolefin-based polymers such as polyethylene, polypropylene, cyclo-based or norbornene-structure-containing polyolefin, and ethylene-propylene copolymers, vinyl chloride-based polymers, amide-based polymers such as nylon and aromatic polyamide, imide-based polymers, sulfone-based polymers, polyether sulfone-based polymers, polyether ether ketone-based polymers, polyphenylene sulfide-based polymers, vinyl alcohol-based polymers, vinylidene chloride-based polymers, vinyl butyral-based polymers, arylate-based polymers, polyoxymethylene-based polymers, epoxy-based polymers, or any blends of the above polymers.

The protective film 3 may also contain any type of one or more appropriate additives. Examples of such additives include ultraviolet absorbers, antioxidants, lubricants, plasticizers, release agents, discoloration preventing agents, flame retardants, nucleating agents, antistatic agents, pigments, and colorants. The content of the thermoplastic resin in the transparent protective film is preferably from 50 to 100% by weight, more preferably from 50 to 99% by weight, even more preferably from 60 to 98% by weight, further more preferably from 70 to 97% by weight. If the content of the thermoplastic resin in the protective film 3 is 50% by weight or less, high transparency and other properties inherent in the thermoplastic resin may fail to be sufficiently exhibited.

The protective film 3 may also be, for example, a retardation film, a brightness enhancement film, or a diffusion film. The retardation film may have an in-plane retardation of 40 nm or more and/or a thickness direction retardation of 80 nm or more. The in-plane retardation is generally adjusted to fall within the range of 40 to 200 nm, and the thickness direction retardation is generally adjusted to fall within the range of 80 to 300 nm. When a retardation film is used as the protective film 3, the retardation film can also serve as a polarizer protecting film, which contributes to thickness reduction.

The retardation film may be a birefringent film formed by subjecting a thermoplastic resin film to uniaxial or biaxial stretching. The stretching temperature, the stretch ratio, and other conditions may be appropriately selected depending on the retardation value, the film material, and the thickness.

The thickness of the protective film 3 may be selected as needed. In general, the thickness of the protective film 3 is from about 1 to about 500 μm in view of strength, workability such as handleability, and thin layer formability. In particular, the thickness of the protective film is preferably from 1 to 300 μm, more preferably from 5 to 200 μm. Particularly when a single protective film is used, the thickness of the protective film is preferably 100 μm or less, more preferably 80 μm or less, even more preferably 60 μm or less for thickness reduction. In order to protect the polarizing film 10 from buckling and breaking, the thickness of the protective film is preferably 10 μm or more, more preferably 20 μm or more.

Two or more protective films 3 may also be used together. In order to protect the polarizing film 10 from buckling and breaking, a total thickness of the two or more protective films is preferably 10 μm or more, more preferably 20 μm or more. In order to reduce the thickness of the polarizing film 10, a total thickness of the protective films is preferably 100 μm or less.

The surface of the protective film 3, opposite to its surface where the polarizer 1 is bonded, may be provided with a functional layer such as a hard coat layer, an anti-reflection layer, an anti-sticking layer, a diffusion layer, or an antiglare layer. The functional layer such as a hard coat layer, an anti-reflection layer, an anti-sticking layer, a diffusion layer, or an antiglare layer may be provided as part of the protective film 3 itself or as a layer independent of the protective film 3.

The protective film 3 and the polarizer 1 are laminated with an adhesive layer 3a (an intervening layer such as a pressure-sensitive-adhesive layer, or an undercoat layer (primer layer)), between them. In this case, the intervening layer should preferably be used to laminate them with no air gap between them. The protective film 3 and the polarizer 1 are preferably laminated with an adhesive layer 3a interposed therebetween.

The adhesive layer 3a is made from an adhesive. Any of various types of adhesives may be used. The adhesive layer 3a may be of any optically-transparent type. The adhesive may be any of various types, such as a water-based adhesive, a solvent-based adhesive, a hot melt-based adhesive, and an active energy ray-curable adhesive. A water-based adhesive or an active energy ray-curable adhesive is preferred.

The water-based adhesive may be, for example, an isocyanate-based adhesive, a polyvinyl alcohol-based adhesive, a gelatin-based adhesive, a vinyl-based adhesive, a latex-based adhesive, or a water-based polyester adhesive. The water-based adhesive is generally used in the form of an aqueous solution, which generally has a solids content of 0.5 to 60% by weight. Thereamong, particularly preferred are an isocyanate-based adhesive and a polyvinyl alcohol-based adhesive. A urethane-based resin layer can be formed as the adhesive layer from an isocyanate-based adhesive.

The active energy ray-curable adhesive is an adhesive capable of being cured by exposure to active energy rays such as electron beams or ultraviolet rays (a radically or cationically curable adhesive). The active energy ray-curable adhesive to be used may be of, for example, an electron beam-curable type or an ultraviolet-curable type. The active energy ray-curable adhesive may be, for example, a photo-radically curable adhesive. The photo-radically curable type active energy ray-curable adhesive may be of an ultraviolet-curable type. In this case, the adhesive should contain a radically polymerizable compound and a photopolymerization initiator. For example, an ultraviolet-curable acryl-based resin is preferred for the radically-curable, ultraviolet-curable adhesive, and an ultraviolet-curable epoxy-based resin is preferred for the cationically-curable, ultraviolet-curable adhesive.

The method for applying the adhesive is appropriately selected depending on the viscosity of the adhesive and the desired thickness. Examples of application means include a reverse coater, a gravure coater (direct, reverse, or offset), a bar reverse coater, a roll coater, a die coater, a bar coater, and a rod coater. Any other suitable application method such as dipping may also be used.

The thickness of the adhesive layer 3a is preferably from 0.1 μm to 5 μm. The preferred range of the thickness of the adhesive layer can be selected depending on the type of the water-based adhesive or the active energy ray-curable adhesive. In order to maintain the level of adhering strength, the thickness is preferably 0.1 μm or more. In order to ensure optical reliability, the thickness is preferably 5 μm or less. When the water-based adhesive or the like is used, the adhesive is preferably applied so as to finally form an adhesive layer 3a with a thickness of 100 to 300 nm. The thickness of the adhesive layer 3a is more preferably from 100 to 250 nm. On the other hand, when the active energy ray-curable adhesive is used, the adhesive layer 3a is preferably formed with a thickness of 0.2 to 5 μm. The thickness is more preferably from 0.2 to 2 μm, even more preferably from 0.5 to 1.5 μm.

In the process of laminating the polarizer 1 and the protective film 3, an adhesion-facilitating layer may be placed between the protective film 3 and the adhesive layer 3a. The adhesion-facilitating layer may be made of, for example, any of various resins having a polyester skeleton, a polyether skeleton, a polycarbonate skeleton, a polyurethane skeleton, a silicone skeleton, a polyamide skeleton, a polyimide skeleton, a polyvinyl alcohol skeleton, or other polymer skeletons. These polymer resins may be used singly or in combination of two or more. Other additives may also be added to form the adhesion-facilitating layer. More specifically, a tackifier, an ultraviolet absorber, an antioxidant, or a stabilizer such as a heat-resistant stabilizer may also be used to form the adhesion-facilitating layer.

The adhesion-facilitating layer is usually provided in advance on the protective film, and then the adhesion-facilitating layer side of the protective film is bonded to the polarizer 1 with the adhesive layer 3a. The adhesion-facilitating layer can be formed using a known technique that includes applying an adhesion-facilitating-layer-forming material onto the protective film and drying the material. The adhesion-facilitating-layer-forming material is generally prepared in the form of a solution which is diluted to a suitable concentration taking into account the coating thickness after drying, the smoothness of the application, and other factors. After dried, the adhesion-facilitating layer preferably has a thickness of 0.01 to 5 μm, more preferably 0.02 to 2 μm, even more preferably 0.05 to 1 μm. Two or more adhesion-facilitating layers may be provided. Also in this case, the total thickness of the adhesion-facilitating layers preferably falls within these ranges.

The pressure-sensitive-adhesive layer is made from a pressure-sensitive-adhesive. Any of various pressure-sensitive-adhesives may be used, examples of which include rubber-based pressure-sensitive-adhesives, acryl-based pressure-sensitive-adhesives, silicone-based pressure-sensitive-adhesives, polyurethane-based pressure-sensitive-adhesives, vinyl alkyl ether-based pressure-sensitive-adhesives, polyvinylpyrrolidone-based pressure-sensitive-adhesives, polyacrylamide-based pressure-sensitive-adhesives, and cellulose-based pressure-sensitive-adhesives. The base polymer with adhesive properties is selected depending on the type of the pressure-sensitive-adhesive. Among these pressure-sensitive-adhesives, acryl-based pressure-sensitive-adhesives are preferably used because they have a high level of optical transparency, weather resistance, heat resistance, and other properties, and exhibit an appropriate level of wettability and adhesive properties including cohesiveness and adhesiveness.

The undercoat layer (primer layer) is formed to improve the adhesion between the polarizer 1 and the protective film 3. The primer layer may be made of any material capable of providing somewhat strong adhesion to both the polarizer 1 and the protective film 3. For example, a thermoplastic resin having a high level of transparency, thermal stability, and stretchability may be used to form the primer layer. Such a thermoplastic resin may be, for example, an acryl-based resin, a polyolefin-based resin, a polyester-based resin, a polyvinyl alcohol-based resin, or any mixture thereof.

When at least two protective films 3 are used as mentioned above, the protective films may be laminated with an adhesive layer or the like as mentioned above interposed between the respective protective films.

2. Pressure-Sensitive-Adhesive-Layer-Attached Polarizing Film

The pressure-sensitive-adhesive-layer-attached polarizing film of the present invention has the polarizing film 10; and a pressure-sensitive-adhesive layer 4 on a surface of the transparent resin layer 2 that is opposite to the surface of the layer 2 that has the polarizer 1, this layer 2 being in the polarizing film 10.

Figure 3:
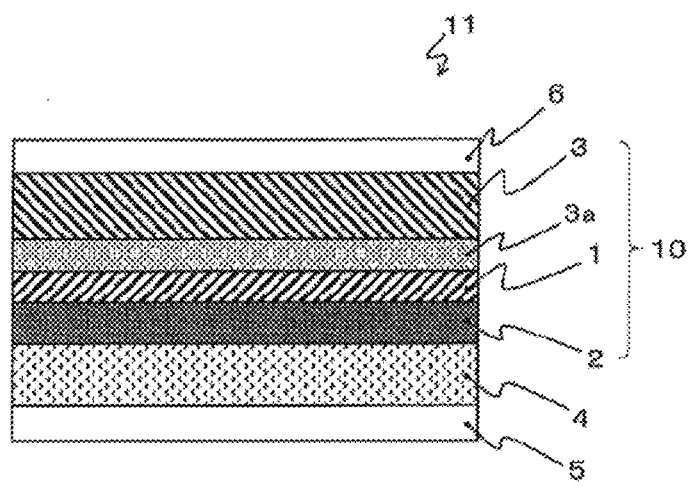
FIG. 3 is an example of a schematic cross-sectional view of the pressure-sensitive-adhesive-layer-attached polarizing film of the invention.

Referring to FIG. 3, the pressure-sensitive-adhesive-layer-attached polarizing film of the present invention will be described. However, the invention is not limited into this figure.

As illustrated in FIG. 3, a pressure-sensitive-adhesive-layer-attached polarizing film 11 of the present invention has a polarizing film 10 and a pressure-sensitive-adhesive layer 4. As illustrated in FIG. 3, the pressure-sensitive-adhesive layer 4 may be laid on the transparent resin layer 2 side of the polarizing film 10 (side of the transparent resin layer 2 that has no polarizer 1). The pressure-sensitive-adhesive layer 4 may be laid on the protective film 3 side of the polarizing film (side of a protective film 3 that has no polarizer). However, the embodiment in FIG. 3 (embodiment in which the transparent resin layer 2 has, on a side thereof that has no polarizer 1, the pressure-sensitive-adhesive layer 4) is preferred from the viewpoint of a restraint of a warp of a display panel after the panel is bonded to the polarizing film, a restraint of the occurrence of nano-slits, and others. A separator 5 may be laid on the pressure-sensitive-adhesive layer 4 of the pressure-sensitive-adhesive-layer-attached polarizing film 11 of the present invention. On a side of the polarizing film 11 that is opposite to the separator 5, a surface-protective film 6 may be laid. In the pressure-sensitive-adhesive-layer-attached polarizing film 11 illustrated in FIG. 3, a case is shown in which both of the separator 5 and the surface-protective film 6 are laid. The pressure-sensitive-adhesive-layer-attached polarizing film 11 having at least the separator 5 (and further having the surface-protective film 6) is usable in the form of a wound body. This film 11 is favorable for being applied to, for example, such a manner that the pressure-sensitive-adhesive-layer-attached polarizing film 11 unwound from the wound body and then transported by aid of the separator 5 is bonded to a surface of an image display panel through the pressure-sensitive-adhesive layer 4 (the manner will be referred to also as a "roll-to-panel manner" hereinafter, and a typical example thereof is in the specification of Japanese Patent No. 4406043).

The polarizing film 10 may be the above-mentioned polarizing film. Also in the pressure-sensitive-adhesive-layer-attached polarizing film 11, it is preferred in the same manner as in the polarizing film 10 that the polarizer 1 has a relaxation layer 1a in which the alignment of a polyvinyl alcohol-based resin is partially relaxed (that is, in which polarization is partially relaxed).

The pressure-sensitive adhesive layer 4 may be formed using any appropriate type of pressure-sensitive-adhesive. The type of pressure-sensitive-adhesive is not particularly limited. Examples of the pressure-sensitive-adhesive include a rubber-based pressure-sensitive-adhesive, an acryl-based pressure-sensitive-adhesive, a silicone-based pressure-sensitive-adhesive, a urethane-based pressure-sensitive-adhesive, a vinyl alkyl ether-based pressure-sensitive-adhesive, a polyvinyl alcohol-based pressure-sensitive-adhesive, a polyvinylpyrrolidone-based pressure-sensitive-adhesive, a polyacrylamide-based pressure-sensitive-adhesive, and a cellulose-based pressure-sensitive-adhesive.

Among these pressure-sensitive-adhesives, those having a high level of optical transparency and weather resistance or heat resistance and exhibiting an appropriate level of wettability and adhesive properties such as cohesiveness and adhesiveness are preferably used. An acryl-based pressure-sensitive-adhesive is preferably used because it has such properties.

The pressure-sensitive-adhesive layer 4 can be formed by a method including applying the pressure-sensitive-adhesive to a release-treated separator or other means, removing the polymerization solvent and other components from the adhesive by drying to form a pressure-sensitive-adhesive layer, and then transferring the pressure-sensitive-adhesive layer onto the transparent resin layer (or onto the protective film) of the polarizer 1. Alternatively, the pressure-sensitive-adhesive layer can be formed by a method including applying the pressure-sensitive-adhesive to the transparent resin layer (or to the protective film) of the polarizer 1 and removing the polymerization solvent and other components from the adhesive by drying to form a pressure-sensitive-adhesive layer on the polarizer 1. In the process of applying the pressure-sensitive-adhesive, if necessary, one or more solvents other than the polymerization solvent may be newly added to the adhesive.

A silicone release liner is preferably used as the release-treated separator. In the invention, the pressure-sensitive-adhesive may be applied to such a liner and then dried to form a pressure-sensitive-adhesive layer. In this process, any appropriate method may be used for drying the pressure-sensitive-adhesive, depending on purpose. Preferably, a method of heating and drying the coating film is used. The heating and drying temperature is preferably from 40° C. to 200° C., more preferably from 50° C. to 180° C., even more preferably from 70° C. to 170° C. When the heating temperature is set in the range, a pressure-sensitive-adhesive with a high level of adhesive properties can be obtained.

Any appropriate drying time may be used as needed. The drying time is preferably from 5 seconds to 20 minutes, more preferably from 5 seconds to 10 minutes, even more preferably from 10 seconds to 5 minutes.

Various methods may be used to form the pressure-sensitive-adhesive layer. Examples of such methods include roll coating, kiss roll coating, gravure coating, reverse coating, roll brush coating, spray coating, dip roll coating, bar coating, knife coating, air knife coating, curtain coating, lip coating, and extrusion coating with a die coater or other means.

To resist peeling, the pressure-sensitive-adhesive layer 4 preferably has a thickness of 1 µm or more, more preferably 5 µm or more. On the other hand, if the pressure-sensitive-adhesive layer 4 is too thick, mechanical shock applied after the bonding of the polarizing film to a liquid crystal cell can cause the polarizer 1 to bend significantly so that nano-slits can easily occur. Therefore, the pressure-sensitive-adhesive layer preferably has a thickness of 40 µm or less, more preferably 35 µm or less, even more preferably 25 µm or less. Also in order to suppress thermal shock-induced shrinkage of the polarizer 1, the pressure-sensitive-adhesive layer 4 preferably has a thickness of 35 µm or less.

When the pressure-sensitive-adhesive layer 4 is exposed, as described above, the pressure-sensitive-adhesive layer 4 can be protected by a separator 5 (release-treated sheet) until it is actually used.

Examples of the material used to form such a separator 5 include a plastic film such as a polyethylene, polypropylene, polyethylene terephthalate, or polyester film, a paper, a cloth, a porous material such as nonwoven fabric, and appropriate thin materials such as a net, a foamed sheet, a metal foil, and any laminate thereof. A plastic film is preferably used because of its good surface smoothness.

Such a plastic film may be of any type capable of protecting the pressure-sensitive-adhesive layer 4. Such a plastic film may be, for example, a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, or an ethylene-vinyl acetate copolymer film.

The separator 5 generally has a thickness of about 5 to about 200 µm, preferably about 5 to about 100 µm. If necessary, the separator 5 may be subjected to a release treatment and an anti-pollution treatment with a silicone-based, fluoride-based, long-chain alkyl-based, or fatty acid amide-based release agent, a silica powder, or other materials, or subjected to an antistatic treatment of coating type, kneading and mixing type, vapor-deposition type, or other types. In particular, when the surface of the separator 5 is appropriately subjected to a release treatment such as a silicone treatment, a long-chain alkyl treatment, or a fluorine treatment, the releasability from the pressure-sensitive-adhesive layer 4 can be further improved.

A surface protective film 6 generally has a base film and a pressure-sensitive-adhesive layer. The surface protective film 6 protects the polarizing film 10 (protective film 3) with the pressure-sensitive-adhesive layer interposed between them.

In view of the ability to be tested or managed, an isotropic or nearly-isotropic film material should be selected as the base film for the surface protective film 6. Examples of such a film material include polyester-based resins such as polyethylene terephthalate films, cellulose-based resins, acetate-based resins, polyethersulfone-based resins, polycarbonate-based resins, polyamide-based resins, polyimide-based resins, polyolefin-based resins, acryl-based resins, and other transparent polymers. In particular, polyester-based resins are preferred. The base film may be made of a single film material or a laminate of two or more film materials. The base film may also be a product obtained by stretching the film. The base film generally has a thickness of 500 µm or less, preferably 10 to 200 µm.

The pressure-sensitive-adhesive used to form the pressure-sensitive-adhesive layer for the surface protective film 6 may be appropriately selected from pressure-sensitive-adhesives including, as a base polymer, a (meth)acryl-based polymer, a silicone-based polymer, polyester, polyurethane, polyamide, polyether, fluoride-based polymer, rubber-based polymer, or any other polymer. An acrylic pressure-sensitive-adhesive containing a (meth)acryl-based polymer as a base polymer is preferred in view of transparency, weather resistance, heat resistance, and other properties. The thickness (dry thickness) of the pressure-sensitive-adhesive layer is selected depending on the desired adhesive strength. The thickness of the pressure-sensitive-adhesive is generally from about 1 to about 100 µm, preferably from 5 to 50 µm.

A silicone, long-chain alkyl, or fluorine treatment with a low-adhesion material may also be performed to form a release treatment layer on the surface of the base film of the surface protective film 6, opposite to its surface on which the pressure-sensitive-adhesive layer is provided.

3. Laminated Optical Film

For practical use, the polarizing film 10 of the invention or the pressure-sensitive-adhesive-layer-attached polarizing film 11 of the invention may be laminated with any other optical layer or layers to form a laminated optical film. As a non-limiting example, such an optical layer or layers may be one or more optical layers that have ever been used to form liquid crystal display devices or other devices, such as a reflector, a transflector, a retardation plate (including a wavelength plate such as a half or quarter wavelength plate), or a viewing angle compensation film. Particularly preferred is a reflective or transflective polarizing film including a laminate of the polarizing film 10 or 11 of the invention and a reflector or a transflector, an elliptically or circularly polarizing film including a laminate of the polarizing film 10 or 11 of the invention and a retardation plate, a wide viewing angle polarizing film including a laminate of the polarizing film 10 or 11 of the invention and a viewing angle compensation film, or a polarizing film including a laminate of the polarizing film 10 or 11 of the invention and a brightness enhancement film.

The laminated optical film including a laminate of the above optical layer and the polarizing film 10 or the pressure-sensitive-adhesive-layer-attached polarizing film 11 may be formed by a method of stacking them one by one, for example, in the process of manufacturing a liquid crystal display device. However, the optical film should be formed by stacking them in advance, which is superior in quality stability or assembling workability and thus advantageous in facilitating the process of manufacturing liquid crystal display devices or other devices. In the lamination, any appropriate bonding means such as a pressure-sensitive-adhesive layer may be used. When the polarizing film and any other optical film are bonded together, their optical axes may be each aligned at an appropriate angle, depending on the desired retardation properties or other desired properties.

4. Process for Producing Polarizing Film

The process of the present invention for producing a polarizing film 10 includes:

a step of applying a transparent resin layer forming material including a water-based emulsion resin directly onto at least one surface of a polarizer 1 having a thickness of 10 µm or less, and a step of drying the coating layer of the transparent resin layer forming material to form a transparent resin layer 2 having a thickness of 0.1 µm or more.

The polarizer 1, the thickness of which is 10 µm or less, and the transparent resin layer 2 and the transparent resin layer forming material for forming the transparent resin layer 2 are as described above.

In the producing process of the present invention, the transparent resin layer forming material, which includes the water-based emulsion resin, is directly applied onto at least one surface of the polarizer 1. By applying the transparent resin layer forming material, which includes the water-based emulsion resin, directly onto the polarizer 1 in this way, a relaxation layer 1a can be formed on the polarizer 1.

For the step of applying the transparent resin layer forming material, various methods are usable. Specific examples thereof include roll coating, kiss roll coating, gravure coating, reverse coating, roll brushing, spray coating, dip roll coating, bar coating, knife coating, air knife coating, curtain coating, lip coating, and extrusion coating using, for example, a die coater.

In order that in the applying step, the transparent resin layer 2 to be formed will have the above-mentioned thickness (thickness of the dried layer), a coating amount therefor is controlled.

Next, in the formation of the transparent resin layer 2, the coating layer of the transparent resin layer forming material is dried. The drying temperature is not particularly limited, and may be appropriately set in accordance with the composition and the concentration of the transparent resin layer forming material. The temperature is, for example, from about 40 to about 120° C., more preferably from 60 to 100°

C. The drying period is preferably from about 10 seconds to about 10 hours, more preferably from about 20 seconds to about 1 hour.

After the outer surface of the polarizer 1 is subjected to an adhesion-facilitating treatment, such as corona treatment or plasma treatment, to improve adhesion between the polarizer 1 and the transparent resin layer 2, the transparent resin layer 2 can be formed.

The pressure-sensitive-adhesive-layer-attached polarizing film of the present invention can be formed by forming the pressure-sensitive-adhesive layer 4 onto a surface of the transparent resin layer 2 that is opposite to the surface of this layer 2 that has the polarizer 1, the transparent resin layer 2 being in the polarizing film 10 yielded by the above-mentioned producing process.

5. Image Display Device

The polarizing film 10, the pressure-sensitive-adhesive-layer-attached polarizing film 11, or the above-mentioned laminated optical film according to the invention is preferably used to form various image display devices such as liquid crystal display devices and organic EL display devices. Liquid crystal display devices may be formed according to conventional techniques. Specifically, a liquid crystal display device may be typically formed according to any conventional techniques by appropriately assembling a liquid crystal cell, pressure-sensitive-adhesive-layer-attached polarizing films or optical films, and optional components such as a lighting system, incorporating a driving circuit, and performing other processes, except that the polarizing film 10, the pressure-sensitive-adhesive-layer-attached polarizing film 11, or the above-mentioned laminated optical film according to the invention is used. The liquid crystal cell to be used may also be of any type, such as IPS type or VA type. The invention is particularly suitable for IPS type.

Any desired liquid crystal display device may be formed, such as a liquid crystal display device including a liquid crystal cell and the polarizing film 10 or films, the pressure-sensitive-adhesive-layer-attached polarizing film 11 or films, or the above-mentioned laminated optical film or films placed on one or both sides of the liquid crystal cell, or a liquid crystal display device further including a backlight or a reflector in the lighting system. In such a case, the polarizing film 10 or films, the pressure-sensitive-adhesive-layer-attached polarizing film 11 or films or the above-mentioned laminated optical film or films according to the invention may be placed on one or both sides of the liquid crystal cell. When the polarizing films, the pressure-sensitive-adhesive-layer-attached polarizing films, or the laminated optical films are provided on both sides, they may be the same or different. The process of forming the liquid crystal display device may also include placing, at an appropriate position or positions, one or more layers of an appropriate component such as a diffusion plate, an antiglare layer, an anti-reflection film, a protective plate, a prism array, a lens array sheet, a light diffusion plate, or a backlight.

EXAMPLES

Hereinafter, the invention will be more specifically described with reference to examples. It will be understood that the examples shown below are not intended to limit the invention. In each example, "parts" and "%" are all by weight. Unless otherwise specified below, the conditions of standing at room temperature include 23° C. and 65% RH in all cases.

Production Example 1 (Production of Polarizer A0)

A corona treatment was performed on one surface of an amorphous isophthalic acid-copolymerized polyethylene terephthalate (IPA-copolymerized PET) film substrate (100 µm in thickness) with a water absorption of 0.75% and a glass-transition temperature (Tg) of 75° C. An aqueous solution containing polyvinyl alcohol (4,200 in polymerization degree, 99.2% by mole in saponification degree) and acetoacetyl-modified PVA (Gohsefimer Z200 (trade name) manufactured by The Nippon Synthetic Chemical Industry Co., Ltd., 1,200 in polymerization degree, 4.6% in acetoacetyl modification degree, 99.0% by mole or more in saponification degree) in a ratio of 9:1 was applied to the corona-treated surface at 25° C. and then dried to form a 11-µm-thick PVA-based resin layer, so that a laminate was formed.

In an oven at 120° C., the resulting laminate was subjected to free-end uniaxial stretching to 2.0 times in the longitudinal direction between rolls at different peripheral speeds (auxiliary in-air stretching).

Subsequently, the laminate was immersed in an insolubilization bath (an aqueous boric acid solution obtained by adding 4 parts by weight of boric acid to 100 parts by weight of water) at a temperature of 30° C. for 30 seconds (insolubilization).

Subsequently, the laminate was immersed in a dyeing bath at a temperature of 30° C. while the iodine concentration and the immersion time were so controlled as to allow the resulting polarizing plate to have a predetermined transmittance. In this example, the laminate was immersed for 60 seconds in an aqueous iodine solution obtained by adding 0.2 parts by weight of iodine and 1.0 part by weight of potassium iodide to 100 parts by weight of water (dyeing).

Subsequently, the laminate was immersed for 30 seconds in a crosslinking bath (an aqueous boric acid solution obtained by adding 3 parts by weight of potassium iodide and 3 parts by weight of boric acid to 100 parts by weight of water) at a temperature of 30° C. (crosslinking).

The laminate was then uniaxially stretched to a total stretch ratio of 5.5 times in the longitudinal direction between rolls at different peripheral speeds while it was immersed in an aqueous boric acid solution (an aqueous solution obtained by adding 4 parts by weight of boric acid and 5 parts by weight of potassium iodide to 100 parts by weight of water) at a temperature of 70° C. (in-water stretching).

The laminate was then immersed in a cleaning bath (an aqueous solution obtained by adding 4 parts by weight of potassium iodide to 100 parts by weight of water) at a temperature of 30° C. (cleaning).

The resulting product was an optical film laminate including a 5-µm-thick polarizer A0.

Production Examples 2 to 8 (Production of Polarizers A1 to A7)

Polarizers A1 to A7 were prepared similarly to the production example 1 described above, except that the preparation conditions were changed as shown in Table 1. Table 1 also shows the thicknesses, optical properties (single-body transmittance and polarization degree), and boric acid contents of polarizers A1 to A7.

TABLE 1

| | | | Producing process | | | | | |
|---|---|---|---|---|---|---|---|---|
| | | | | Dyeing treatment | | | In-water stretching treatment | |
| | | | | | | | Boric | |
| | | PVA-based resin layer thickness (μm) | In-air auxiliary stretching treatment Stretch ratio | Iodine blend amount (parts by weight) | Potassium iodide blend amount (part by weight) | Immersion period (seconds) | acid blend amount (parts by weight) | Potassium iodide blend amount (part by weight) |
| Production Example 1 | Polarizer A0 | 11 | 2.0 | 0.2 | 1.0 | 60 | 4 | 5 |
| Production Example 2 | Polarizer A1 | 11 | 2.0 | 0.2 | 1.0 | 60 | 3.5 | 5 |
| Production Example 3 | Polarizer A2 | 11 | 2.0 | 0.2 | 1.0 | 60 | 4.2 | 5 |
| Production Example 4 | Polarizer A3 | 11 | 2.0 | 0.2 | 1.0 | 60 | 4.5 | 5 |
| Production Example 5 | Polarizer A4 | 7 | 2.0 | 0.2 | 1.0 | 60 | 4 | 5 |
| Production Example 6 | Polarizer A5 | 15 | 2.0 | 0.2 | 1.0 | 60 | 4 | 5 |
| Production Example 7 | Polarizer A6 | 11 | 2.0 | 0.2 | 1.0 | 50 | 4 | 5 |
| Production Example 8 | Polarizer A7 | 11 | 2.0 | 0.2 | 1.0 | 90 | 4 | 5 |

| | | Producing process | | | | | | |
|---|---|---|---|---|---|---|---|---|
| | | In-water stretching treatment | | Cleaning treatment Potassium iodide blend amount (parts by weight) | Polarizer | | | |
| | | Stretch ratio | Total stretch ratio | | Thickness (μm) | Single-body transmittance T (%) | Polarization degree P (%) | Boric acid content (% by weight) |
| Production Example 1 | Polarizer A0 | 2.75 | 5.5 | 4 | 5 | 42.8 | 99.99 | 16 |
| Production Example 2 | Polarizer A1 | 2.75 | 5.5 | 4 | 5 | 42.8 | 99.99 | 14 |
| Production Example 3 | Polarizer A2 | 2.75 | 5.5 | 4 | 5 | 42.8 | 99.99 | 18 |
| Production Example 4 | Polarizer A3 | 2.75 | 5.5 | 4 | 5 | 42.8 | 99.99 | 20 |
| Production Example 5 | Polarizer A4 | 2.75 | 5.5 | 4 | 3 | 42.8 | 99.99 | 16 |
| Production Example 6 | Polarizer A5 | 2.75 | 5.5 | 4 | 7 | 42.8 | 99.99 | 16 |
| Production Example 7 | Polarizer A6 | 2.75 | 5.5 | 4 | 5 | 44.1 | 99.99 | 16 |
| Production Example 8 | Polarizer A7 | 2.75 | 5.5 | 4 | 5 | 41.5 | 99.99 | 16 |

Production Example 9

(Preparation of Monomer Emulsion)

Monomer components shown in Table 2 were added to a vessel to be mixed with each other. Next, to 200 parts of the prepared monomer components were added 12 parts of a product AQUALON HS-10 (manufactured by Dai-ichi Kogyo Seiyaku Co., Ltd.), which is a reactive surfactant, and 127 parts of ion exchange water. A homo-mixer (manufactured by Tokushu Kika Kogyo co. ltd.) was used to stir these components at 6000 rpm for 5 minutes to emulsify the components forcibly to prepare a monomer emulsion (A-1).

In another vessel, to 600 parts of the monomer components prepared at the above-mentioned ratio were added 12 parts of a product AQUALON HS-10 (manufactured by Dai-ichi Kogyo Seiyaku Co., Ltd.), which is a reactive surfactant, and 382 parts of ion exchange water. A homo-mixer (manufactured by Tokushu Kika Kogyo Co. Ltd.) was used to stir these components at 6000 rpm for 5 minutes to emulsify the components forcibly to prepare a monomer emulsion (A-2).

(Preparation of Transparent Resin Layer Forming Material A)

Into a reaction vessel equipped with a condenser, a nitrogen gas inlet tube, a thermometer, a dropping funnel, and a stirring blade were charged 339 parts of the monomer emulsion (A-1) prepared as described above, and 442 parts of ion exchange water. Next, the reaction vessel was sufficiently purged with nitrogen, and then thereto were added 0.6 parts of ammonium persulfate. While the reaction system was stirred, the polymerizable components were polymerized at 60° C. for 1 hour. Next, 994 parts of the monomer emulsion (A-2) were dropwise added into the reaction vessel over 3 hours while the temperature of the reaction vessel was kept at 60° C. Thereafter, the polymerizable components were polymerized for 3 hours to yield a polymer emulsion having a solid concentration of 46.0%. Next, the polymer emulsion was cooled to room temperature, and then thereto was added ammonia water having a concentration of 10% to neutralize the pH of the system to 8. Furthermore, to 100 parts of the neutralized polymer emulsion were added 4.6 parts of diethylene glycol monobutyl ether acetate as a film-forming aid. The components were then mixed with each other to yield a transparent resin layer forming material A having a solid content of 44.0%.

Production Examples 10 to 12

Transparent resin layer forming materials B to D were each yielded in the same way as in Production Example 9 except that the above-mentioned composition was changed to compositions respectively shown in Table 2.

name: KAYACURE DETX-S, manufactured by Nippon Kayaku Co., Ltd.). These components were stirred for 1 hour to prepare a coating liquid having a viscosity of 20 mPa·s.

Production Example 15 (Production of Acrylic Forming Material B (of Solvent Type))

In the same preparation of the acrylic forming material A (of the solvent-free type) as in Production Example 14, methyl ethyl ketone was added to the reactants to prepare a coating liquid having a viscosity of 10 mPa·s. In the preparation of an acrylic forming material B (of a solvent type), methyl ethyl ketone was adjusted to set the proportion of the acrylic forming material A (of the solvent-free type) in the solution to 40%.

Production Example 15 (Production of (Water-Soluble) Acrylic Forming Material C)

To 100 parts of a product JULIMAR FC-80 (manufactured by Toagosei Co., Ltd.) were added 900 parts of pure

TABLE 2

| Transparent resin layer forming material | Monomer component composition (part(s)) | | | | | | | | Number-average molecular weight (Mn) | Weight-average molecular weight (Mw) |
| | (Meth)acrylic acid | | Alkyl acrylates | | Alkyl methacrylates | | | Another component | | |
| | AA | MAA | EA | BA | MM | EM | EHM | St | | |
|---|---|---|---|---|---|---|---|---|---|---|
| Production Example 9 | A | — | 1 | 10 | 53 | 36 | — | — | — | 2.0E+04 | 2.4E+05 |
| Production Example 10 | B | — | 2 | 8 | 25 | 65 | — | — | — | 1.9E+04 | 2.9E+05 |
| Production Example 11 | C | — | 5 | — | — | 25 | — | 45 | 25 | 1.1E+04 | 3.2E+04 |
| Production Example 12 | D | 1 | — | 59 | — | 25 | 15 | — | — | 1.3E+04 | 3.9E+04 |

The abbreviations in Table 2 are each as follows:
AA: acrylic acid,
MAA: methacrylic acid,
MM: methyl methacrylate,
EM: ethyl methacrylate,
BA: butyl acrylate,
EA: ethyl acrylate,
EHM: 2-ethylhexyl methacrylate, and
St: styrene.

Production Example 13

A polyester urethane type emulsion material (trade name: SUPERFLEX 150, manufactured by Dai-ichi Kogyo Seiyaku Co., Ltd.) was used as a transparent resin layer forming material E.

Production Example 14 (Production of Acrylic Forming Material A (of Solvent-Free Type))

The following were mixed with each other at 50° C.: 20 parts of N-hydroxyethylacrylamide (trade name: HEAA, manufactured by Kohjin Co., Ltd.); 80 parts of a urethane acrylate (trade name: UV-1700B, manufactured by The Nippon Synthetic Chemical Industry Co., Ltd.); 3 parts of a radical photopolymerization initiator (2-methyl-1-(4-methylthiophenyl)-2-morpholinopropan-1-one; trade name: IRGACURE 907, manufactured by the company BASF); and 2 parts of a photosensitizer (diethylthioxanthone; trade water to prepare an aqueous solution (coating liquid) having a solid concentration of 3% and a viscosity of 10 mP·s.

Production Example 16 (Production of Acrylic Forming Material D (Acrylic Pressure-Sensitive-Adhesive))

Into a four-necked flask equipped with a stirring blade, a thermometer, a nitrogen gas inlet tube, and a condenser was charged a monomer mixture containing 99 parts of butyl acrylate, and 1 part of 4-hydroxybutyl acrylate. Furthermore, to 100 parts (solid basis) of the monomer mixture were charged toluene, and 0.1 parts of 2,2'-azobisisobutyronitrile as a polymerization initiator. While the reaction system was gently stirred, nitrogen gas was introduced into the flask to purge the inside with nitrogen gas. Thereafter, the liquid temperature of the inside of the flask was kept at about 60° C. to conduct a polymerization reaction for 7 hours. Toluene was added to the resultant reaction liquid to adjust the solid concentration therein to 30% to prepare a solution of an acrylic polymer having a weight-average molecular weight of 1600000.

Into 100 parts of the solid in the acrylic polymer solution were blended 1 part of a crosslinking agent (trade name: CORONATE L, manufactured by Nippon Polyurethane Industry Co., Ltd.) containing, as a main component, a compound having an isocyanate group, and 0.2 parts of γ-glycidoxypropylmethoxysilane (trade name: KBM-403, manufactured by Shin-Etsu Chemical Co., Ltd.) to prepare a solution of an acrylic forming material D.

Example 1

(Production of Ultraviolet Curable Adhesive)

The following were mixed with each other to prepare an ultraviolet curable adhesive: 40 parts by weight of N-hydroxyethylacrylamide (HEAA); 60 parts by weight of acryloylmorpholine (ACMO); and 3 parts by weight of a photoinitiator (trade name: IRGACURE 819, manufactured by BASF).

(Production of Transparent Protective Film)

A (meth)acrylic resin film of 40 μm thickness was prepared which had an adhesion-facilitating-treatment-applied-surface and had a lactone ring structure. The adhesion-facilitating-treatment-applied-surface was subjected to corona treatment.

(Production of Single-Side-Protected Polarizing Film A0)

The ultraviolet curable adhesive was applied onto a surface of the polarizer A0 of the optical film laminate yielded in Production Example 1 to give an adhesive layer thickness of 0.5 μm after this workpiece would be dried. The above-mentioned transparent protective film was laminated onto the coating layer to bring the corona treated surface of the transparent protective film into contact with the coating layer. Active energy rays (ultraviolet rays) were radiated to the resultant laminate (amorphous PET substrate/polarizer A0/coating layer of the ultraviolet curable adhesive/transparent protective film) to cure the coating layer of the ultraviolet curable adhesive. For the ultraviolet radiation, the following was used: a gallium-sealed metal halide lamp (radiating instrument: Light HAMMER 10, manufactured by Fusion UV Systems, Inc.; bulb: V bulb; peak illuminance: 1600 mW/cm$^2$; integrated radiation quantity: 1000/mJ/cm$^2$ (at wavelengths of 380 to 440 nm)). The illuminance of ultraviolet rays was measured, using a Sola-Check system manufactured by Solatell Ltd. Next, the amorphous PET substrate was peeled off to produce each single-side-protected polarizing film A0 including the thin polarizer A0.

(Production of Polarizing Film Having Transparent Resin Layer)

A wire bar coater was used to apply the transparent resin layer forming material A yielded in Production Example 9 in which the solid content had been adjusted to 15% onto the polarizer A0 side of the resultant single-side-protected polarizing film A0 containing the polarizer A0 (thickness: 5 μm; polarization degree: 99.99%; transmittance: 42.8%; and boric acid content: 16%), to give a thickness of 1.0 μm after the workpiece would be dried. The forming material was dried at 80° C. for 20 minutes to form a transparent resin layer. On the transparent resin layer formed side of the polarizer, a relaxation layer of 0.3 μm thickness was formed.

Examples 2 to 19, and Comparative Examples 1 to 5

In each of these examples, each polarizing film was produced in the same way as in Example 1 except that the used polarizer, and the transparent resin layer forming material and the solid content therein, and the film thickness of the transparent resin layer were set as shown in Table 3.

Evaluations described below were made, using the polarizers yielded in each of some of the production examples, as well as the polarizing films yielded in each of the working examples and the comparative examples. The evaluation results are shown in Table 3.

<Single-Body Transmittance T and Polarization Degree P of Polarizer>

The single-body transmittance T and polarization degree P of the polarizer obtained in the production examples were measured using an integrating sphere-equipped spectral transmittance meter (DOT-3C manufactured by Murakami Color Research Laboratory Co., Ltd.). The polarization degree P is calculated from the formula below using the transmittance (parallel transmittance Tp) of a laminate of the same two polarizing films with their transmission axes parallel to each other and the transmittance (crossed transmittance Tc) of a laminate of the same two polarizing films with their transmission axes orthogonal to each other.

Polarization degree $P(\%) = \{(Tp-Tc)/(Tp+Tc)\}^{1/2} \times 100$

Each transmittance was expressed as the Y value, which was obtained through luminosity correction using the two-degree field (illuminant C) according to JIS Z 8701 when the transmittance for completely polarized light obtained through a Glan-Taylor prism polarizer was normalized to 100%.

<Measurement of the Content of Boric Acid in Polarizer>

The polarizers obtained in the production examples were subjected to attenuated total reflection (ATR) spectroscopy using polarized light as the measurement light and using a Fourier transform infrared spectrometer (FTIR) (Spectrum 2000 (trade name) manufactured by PerkinElmer, Inc.), in which the boric acid peak (665 cm$^{-1}$) intensity and the reference peak (2,941 cm$^{-1}$) intensity were measured. The boric acid amount index was calculated from the formula below using the resulting boric acid peak intensity and reference peak intensity, and then the boric acid content (% by weight) was determined from the formula below using the calculated boric acid amount index.

(Boric acid amount index)=(the intensity of the boric acid peak at 665 cm$^{-1}$)/(the intensity of the reference peak at 2,941 cm$^{-1}$)

(Boric acid content (% by weight))=(boric acid amount index)×5.54+4.1

<Pressure-Sensitive-Adhesion Index, Hardness, and Indentation Load of Transparent Resin Layer>

In each of the working examples and the comparative examples, these properties were measured by a nano-indentation method. Specifically, a measuring instrument T1900 TriboIndenter ((product name) manufactured by Hysitron, Inc.) was used to push a diamond intender Berkovich (in a trigonally pyramidal form) into the transparent resin layer of one of the polarizing films yielded in the working examples and the comparative examples at a load and unload rate of 100 nN/s to give an indentation quantity of 100 nm. In this way, a load-displacement curve of the sample was measured. A minimum load (μN) in the resultant load-displacement curve was defined as the pressure-sensitive-adhesion index of the sample. A maximum load (μN) given when the indenter was pushed into the transparent resin layer was defined as the indentation load. A value obtained by dividing the maximum load (μN) by the contact protected area (A) therebetween was defined as the hardness of the sample.

<Measurement of Relaxation Layer Thickness>

An optical interference film thickness meter FE-300 (manufactured by Otsuka Electronics Co., Ltd.) was used to measure the film thickness of the transparent resin layer on the polarizer from the transparent resin layer side of one of the polarizing films. In this way, the thickness of the relaxation layer was obtained. Conditions for the analysis thereof were as follows: analysis wavelengths from 450 to 700 nm, and a refractive index of 1.51 according to a periodic analysis. The thickness of the relaxation layer was calculated in accordance with the following formula:

"Relaxation layer thickness"="Transparent resin layer thickness on the polarizer"−"Transparent resin layer on the PET substrate".

<Transportability>

The transportability of (the workpiece of) one of the polarizing films was evaluated in accordance with the following: a case where the pressure-sensitive-adhesion index thereof, the index being measured by a nano-indentation method, was −15.0 μN or less was determined to be bad (x), or a case where the index was more than −15.0 μN was determined to be good (○). If the pressure-sensitive-adhesion index is −15.0 μN or less, the polarizing film (workpiece) expresses pressure-sensitive adhesion properties when this film (workpiece) contacts the transporting roll, which is made of a metal or some other material, in the case of transporting the polarizing film (workpiece) in a production process for the polarizing film. Consequently, a transportation inconvenience is unfavorably caused.

<Suppression of Occurrence of Nano-Slits: Guitar Pick (GP) Test>

Figure 5A:
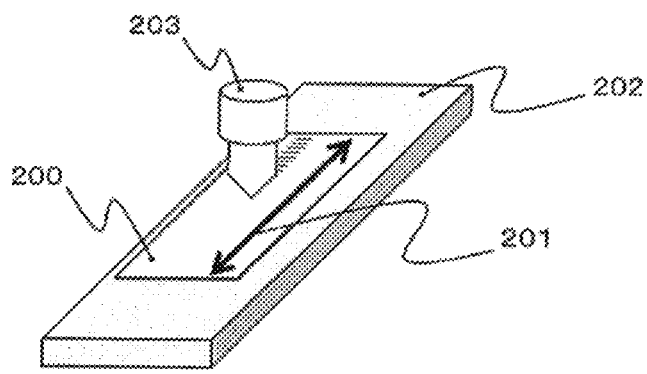
FIGS. 5(a) and 5(b) are schematic views illustrating items to be evaluated for nano-slits in the working examples and the comparative examples.
Figure 5B:
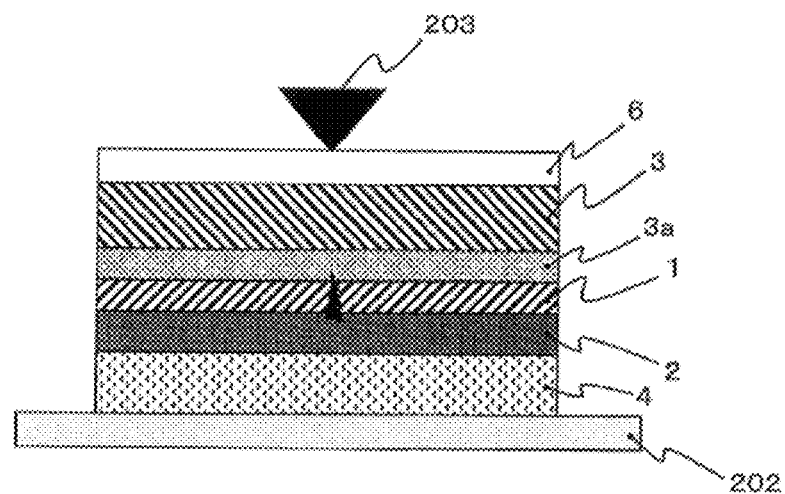

A pressure-sensitive-adhesive layer "a" described below was transferred onto the transparent resin layer 2 of one of the polarizing films yielded in each of the working examples and the comparative examples to form a pressure-sensitive-adhesive-layer-attached polarizing film (transparent protective film 3/adhesive layer 3a/polarizer 1/transparent resin layer 2/pressure-sensitive-adhesive layer 4 in FIGS. 5(a) and 5(b)). The pressure-sensitive-adhesive-layer-attached polarizing film was cut into a piece of 50 mm (in the absorption axis direction)×150 mm size. This piece was used as a sample 200 (having the separator on the pressure-sensitive-adhesive layer 4). The sample 200 was used in the state that a surface-protective film 6 produced as described below was bonded to the protective film 3 side of the sample.

(Pressure-Sensitive-Adhesive Layer "a")

A four-necked flask equipped with a stirring blade, a thermometer, a nitrogen gas inlet tube, and a condenser was charged with 99 parts of butyl acrylate and 1 part of 4-hydroxybutyl acrylate. To the resulting monomer mixture was further added 0.1 parts of 2,2'-azobisisobutyronitrile as a polymerization initiator together with ethyl acetate based on 100 parts (solid basis) of the monomer mixture. After nitrogen gas was introduced to replace the air under gentle stirring, the mixture was subjected to polymerization reaction for 7 hours while the temperature of the liquid in the flask was kept at around 60° C. Ethyl acetate was then added to the resulting reaction liquid, so that a solution of an acryl-based polymer with a weight average molecular weight of 1,400,000 was obtained with an adjusted solid concentration of 30%.

An acryl-based pressure-sensitive-adhesive solution was prepared by adding 0.2 parts of ethylmethylpyrrolidinium-bis(trifluoromethanesulfonyl)imide (manufactured by Tokyo Chemical Industry Co., Ltd.), 1 part of lithium bis(trifluoromethanesulfonyl)imide (manufactured by Mitsubishi Materials Electronic Chemicals Co., Ltd.), 0.1 parts of trimethylolpropane xylylene diisocyanate (TAKENATE D110N manufactured by Mitsui Chemicals, Inc.), 0.3 parts of dibenzoyl peroxide, and 0.075 parts of γ-glycidoxypropylmethoxysilane (KBM-403 manufactured by Shin-Etsu Chemical Co., Ltd.) to the acryl-based polymer solution based on 100 parts of the solids of the polymer solution.

The solution of one of acryl-based pressure-sensitive-adhesive was uniformly applied with a fountain coater to the surface of the silicone-based release agent-treated surface of a polyethylene terephthalate film (separator film) in such a manner that a coating with a thickness of 20 μm could be formed after drying. Subsequently, the adhesive solution was dried in an air circulation-type thermostatic oven at 155° C. for 2 minutes to form a pressure-sensitive-adhesive layer "a" on the surface of the separator film.

(Surface Protective Film 6 for Test)

A backing-forming material of low-density polyethylene with a melt flow rate of 2.0 g/10 min at 190° C. and a density of 0.924 g/cm$^3$ was supplied to an inflation molding machine for co-extrusion. At the same time, a pressure-sensitive-adhesive-forming material of a propylene-butene copolymer (propylene:butene=85:15 in weight ratio, atactic structure) with a melt flow rate of 10.0 g/10 min at 230° C. and a density of 0.86 g/cm$^3$ was supplied to the inflation molding machine with a die temperature of 220° C. and subjected to co-extrusion. A surface protective film 6 composed of a 33-μm-thick backing layer and a 5-μm-thick pressure-sensitive-adhesive layer was produced in this way.

Subsequently, as shown in the schematic view of FIG. 5(a) and the cross-sectional view of FIG. 5(b), the separator (release sheet) was peeled off from the sample 200, and the exposed pressure-sensitive-adhesive layer 4 was used to bond the sample 200 to a glass plate 202 (in FIG. 5(a), 201 indicates the direction of transmission axis of the polarizer). Subsequently, a load of 200 g was applied from a guitar pick 203 (Model No. HP2H (HARD) manufactured by HISTORY) to the center of sample 200 (surface protective film 6 side), and the applied load was reciprocated 50 times within a distance of 100 mm in the direction perpendicular to the absorption axis of polarizer 1 of sample 200. The load was applied to one portion.

Subsequently, after sample 200 was allowed to stand in an environment at 80° C. for 1 hour, it was evaluated whether light-leaking cracks occurred in sample 200, based on the following criteria.

⊙: no cracks
○: 1 to 5 cracks
Δ: 6 to 20 cracks
x: 21 or more cracks

Figure 6A:
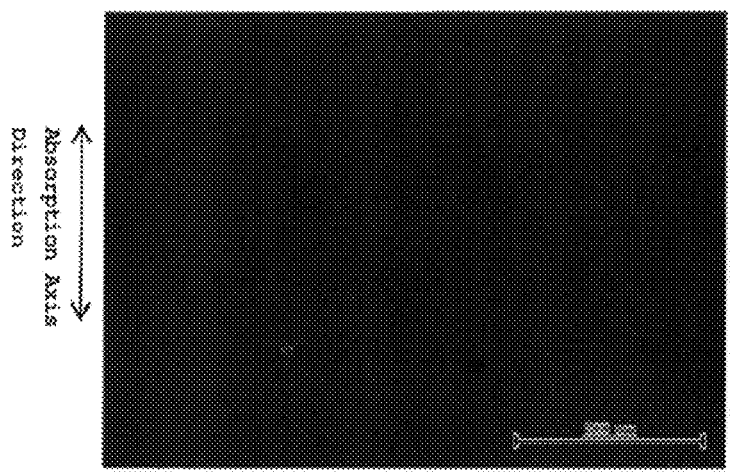
FIGS. 6(a) and 6(b) are exemplary photographs showing whether cracks are caused by nano-slits, for the evaluation of working examples and the comparative examples.
Figure 6B:
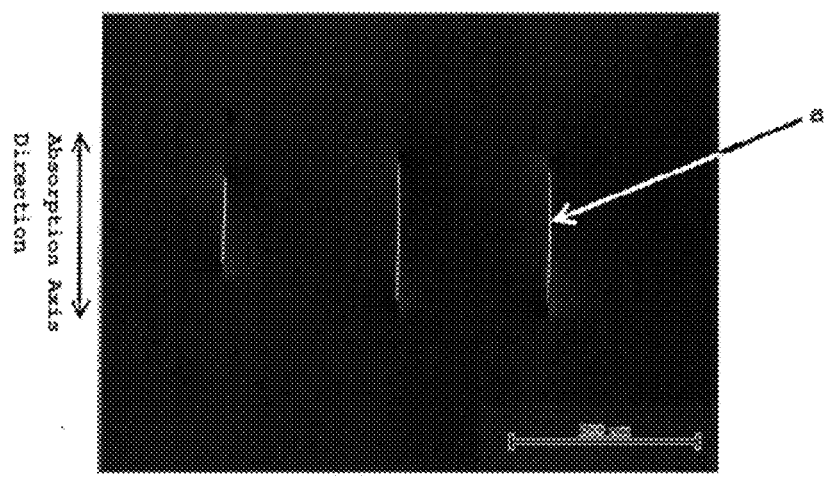

FIGS. 6(a) and 6(b) are each an example of a microscopic photograph of a surface of a polarizing film, and are each an index described below for identifying light-leaking cracks (nano-slits "a") in a guitar pick test of a polarizing film. In FIG. 6(a), light-leaking cracks according to nano-slits "a" are not identified. A state as in FIG. 6(a) corresponds to a state before heating in the guitar pick test of each of the comparative examples, and a state after heating in the guitar pick test of each of the working examples. In the meantime, FIG. 6(b) is a case where three light-leaking cracks-based on nano-slits "a" are generated in the absorption axis direction of the polarizer by heating. A state as in FIG. 6(b) corresponds to a state after heating in the guitar pick test of each of the comparative examples. FIGS. 6(a) and 6(b) are according to observation of the samples in which nano-slits are generated through a differential interference microscope. When the samples were each photographed, the observation was made by the transmitted light in the state that a nano-slit-not-generated sample was set below a nano-slit-generated sample (transmitted light source side) in a crossed Nichol state.

<Initial Peel>

The adhesion of the transparent resin layer to the polarizer of one of the polarizing films was measured according to a cross-cut peel test in JIS K5400 (the number of the cut squares: 100), and then evaluated on the basis of the following criterion:

◯: the number of the peeled squares was zero.

x: the number of the peeled squares was 1 or more.

<Humidification Peel>

One of the polarizing films was put into a constant-temperature and constant-humidification thermostat of 20° C. temperature and 98% R.H. for 24 hours in the state of "transparent resin layer/polarizer/adhesive/transparent protective film", and then the adhesion of the transparent resin layer to the polarizer was measured. A method for the measurement was in accordance with a cross-cut peel test in JIS K5400 (the number of the cut squares: 100), and then evaluated on the basis of the following criterion:

◯: the number of the peeled squares was zero.

x: the number of the peeled squares was 1 or more.

<Optical Proparties>

The single-body transmittance T and polarization degree P of the single-side-protected polarizing films on which the transparent resin layer is formed, and which obtained in the working examples and the comparative examples, were measured using an integrating sphere-equipped spectral transmittance meter (DOT-3C manufactured by Murakami Color Research Laboratory Co., Ltd.). The polarization degree P is calculated from the formula below using the transmittance (parallel transmittance Tp) of a laminate of the same two polarizing films with their transmission axes parallel to each other and the transmittance (crossed transmittance Tc) of a laminate of the same two polarizing films with their transmission axes orthogonal to each other.

Polarization degree $P(\%) = \{(Tp-Tc)/(Tp+Tc)\}^{1/2} \times 100$

Each transmittance was expressed as the Y value, which was obtained through luminosity correction using the two-degree field (illuminant C) according to JIS Z 8701 when the transmittance for completely polarized light obtained through a Glan-Taylor prism polarizer was normalized to 100%.

When a fall of the polarization degree P' value of the transparent-resin-layer-formed polarizer to the measured polarization degree value P of the polarizer was less than 0.01, the single-side-protected polarizing film was determined to be good (◯); when the fall was 0.01 or more and less than 0.02, the film was determined to be fair (Δ); or when the fall was 0.02 or more, the film was determined to be bad (x).

<Reliability>

One of the polarizing films yielded in each of the working examples and the comparative examples was put into a constant-temperature and constant-humidification thermostat of 85° C. temperature and 85% R.H. for 200 hours. An integrating-sphere-attached spectral transmittance measuring meter (Dot-3c, manufactured by Murakami Color Research Laboratory Co., Ltd.) was used to measure the polarization degree of the polarizing film before the putting and that of the polarizing film after the putting, and then gain the variation therebetween in accordance with the following formula:

Variation (ΔP: %) between the polarization degrees="Polarization degree (%) after the putting"–"Polarization degree (%) before the putting".

The polarizing film was evaluated in accordance with the following criterion:

⊙: the variation between the polarization degrees was less than 0.3%.

◯: the variation between the polarization degrees was 0.3% or more, and less than 0.5%.

Δ: the variation between the polarization degrees was 0.5% or more, and less than 1.0%.

x: the variation between the polarization degrees was 1.0% or more.

TABLE 3

| | Polarizer | | | | Relaxation layer Thickness (μm) | Transparent resin layer | | |
|---|---|---|---|---|---|---|---|---|
| | | | | | | | Solid | |
| | Species | Thickness (μm) | Polarization degree P(%) | Single-body transmittance T (%) | Boric acid content (% by weight) | | Material | content (% by weight) | Thickness (μm) |
| Example 1 | A0 | 5 | 99.99 | 42.8 | 16 | 0.3 | Transparent resin layer forming material A | 15 | 1.0 |
| Example 2 | A0 | 5 | 99.99 | 42.8 | 16 | 0.2 | Transparent resin layer forming material B | 15 | 1.0 |
| Example 3 | A0 | 5 | 99.99 | 42.8 | 16 | 0.3 | Transparent resin layer forming material C | 15 | 1.0 |
| Example 4 | A0 | 5 | 99.99 | 42.8 | 16 | 0.3 | Transparent resin layer forming material D | 15 | 1.0 |
| Example 5 | A0 | 5 | 99.99 | 42.8 | 16 | 0.3 | Transparent resin layer forming material E | 15 | 1.0 |
| Example 6 | A5 | 7 | 99.99 | 42.8 | 16 | 0.3 | Transparent resin layer forming material A | 15 | 1.0 |
| Example 7 | A4 | 3 | 99.99 | 42.8 | 16 | 0.3 | Transparent resin layer forming material A | 15 | 1.0 |
| Example 8 | A0 | 5 | 99.99 | 42.8 | 16 | 0.5 | Transparent resin layer forming material A | 25 | 3.0 |
| Example 9 | A0 | 5 | 99.99 | 42.8 | 16 | 0.7 | Transparent resin layer forming material A | 30 | 5.0 |
| Example 10 | A0 | 5 | 99.99 | 42.8 | 16 | 1.4 | Transparent resin layer forming material A | 15 | 5.0 |
| Example 11 | A0 | 5 | 99.99 | 42.8 | 16 | 4.2 | Transparent resin layer forming material A | 5 | 5.0 |
| Example 12 | A0 | 5 | 99.99 | 42.8 | 16 | 0.8 | Transparent resin layer forming material A | 5 | 1.0 |

TABLE 3-continued

| | | | | | | | | | |
|---|---|---|---|---|---|---|---|---|---|
| Example 13 | A0 | 5 | 99.99 | 42.8 | 16 | 0.1 | Transparent resin layer forming material A | 10 | 0.3 |
| Example 14 | A1 | 5 | 99.99 | 42.8 | 14 | 0.3 | Transparent resin layer forming material A | 15 | 1.0 |
| Example 15 | A2 | 5 | 99.99 | 42.8 | 18 | 0.3 | Transparent resin layer forming material A | 15 | 1.0 |
| Example 16 | A3 | 5 | 99.99 | 42.8 | 20 | 0.3 | Transparent resin layer forming material A | 15 | 1.0 |
| Example 17 | A6 | 5 | 99.99 | 44.1 | 16 | 0.3 | Transparent resin layer forming material A | 15 | 1.0 |
| Example 18 | A7 | 5 | 99.99 | 41.5 | 16 | 0.3 | Transparent resin layer forming material A | 15 | 1.0 |
| Example 19 | A0 | 5 | 99.99 | 42.8 | 16 | 1.5 | Transparent resin layer forming material A | 40 | 15.0 |
| Comparative Example 1 | A0 | 5 | 99.99 | 42.8 | 16 | — | None | — | 0.0 |
| Comparative Example 2 | A0 | 5 | 99.99 | 42.8 | 16 | 0.0 | Acrylic Forming Material A | 10 | 3.0 |
| Comparative Example 3 | A0 | 5 | 99.99 | 42.8 | 16 | 0.0 | Acrylic Forming Material B | 40 | 3.0 |
| Comparative Example 4 | A0 | 5 | 99.99 | 42.8 | 16 | 0.1 | Acrylic Forming Material C | 5 | 1.0 |
| Comparative Example 5 | A0 | 5 | 99.99 | 42.8 | 16 | 0.0 | Acrylic Forming Material D | 30 | 5.0 |

| | Transparent resin layer | | | Evaluations | | | | | |
|---|---|---|---|---|---|---|---|---|---|
| | Pressure-sensitive-adhesion index (μN) | Hardness (GPa) | Indentation load (μN) | Transportability | GP test | Initial peel | Humidification peel | Optical properties | Reliability |
| Example 1 | −0.9 | 0.09 | 22.5 | ○ | ○ | ○ | ○ | ○ | ◎ |
| Example 2 | −0.7 | 0.20 | 48.3 | ○ | △ | ○ | ○ | ○ | ◎ |
| Example 3 | −0.8 | 0.01 | 3.65 | ○ | ◎ | ○ | ○ | ○ | ○ |
| Example 4 | −3.0 | 0.05 | 13.5 | ○ | ◎ | ○ | ○ | ○ | ○ |
| Example 5 | −2.5 | 0.02 | 6.68 | ○ | ◎ | ○ | ○ | ○ | ◎ |
| Example 6 | −0.9 | 0.09 | 22.5 | ○ | ○ | ○ | ○ | ○ | ◎ |
| Example 7 | −0.9 | 0.09 | 22.5 | ○ | ○ | ○ | ○ | ○ | ◎ |
| Example 8 | −0.9 | 0.09 | 22.5 | ○ | ◎ | ○ | ○ | ○ | ◎ |
| Example 9 | −0.9 | 0.09 | 22.5 | ○ | ◎ | ○ | ○ | ○ | ◎ |
| Example 10 | −0.9 | 0.09 | 22.5 | ○ | ◎ | ○ | ○ | ○ | ◎ |
| Example 11 | −0.9 | 0.09 | 22.5 | ○ | ○ | ○ | ○ | △ | △ |
| Example 12 | −0.9 | 0.09 | 22.5 | ○ | ○ | ○ | ○ | ○ | ◎ |
| Example 13 | −0.9 | 0.09 | 22.5 | ○ | △ | ○ | ○ | ○ | ○ |
| Example 14 | −0.9 | 0.09 | 22.5 | ○ | ◎ | ○ | ○ | ○ | ◎ |
| Example 15 | −0.9 | 0.09 | 22.5 | ○ | ○ | ○ | ○ | ○ | ◎ |
| Example 16 | −0.9 | 0.09 | 22.5 | ○ | ○ | ○ | ○ | ○ | ◎ |
| Example 17 | −0.9 | 0.09 | 22.5 | ○ | ○ | ○ | ○ | ○ | ◎ |
| Example 18 | −0.9 | 0.09 | 22.5 | ○ | ○ | ○ | ○ | ○ | ◎ |
| Example 19 | −0.9 | 0.09 | 22.5 | ○ | ◎ | ○ | ○ | ○ | ◎ |
| Comparative Example 1 | — | — | — | ○ | X | — | — | ○ | ○ |
| Comparative Example 2 | 0 | 6.2 | 133 | ○ | ○ | X | X | ○ | X |
| Comparative Example 3 | −0.7 | 5.44 | 154 | ○ | ○ | X | X | ○ | X |
| Comparative Example 4 | −2.5 | 5.5 | 69.6 | ○ | ○ | ○ | ○ | ○ | X |
| Comparative Example 5 | −18 | 0.001 | 10.2 | X | X | Not evaluated | Not evaluated | ○ | ○ |

DESCRIPTION OF REFERENCE SIGNS

1 Polarizer
1a Relaxation layer
2 Transparent resin layer
3 Protective film
3a Adhesive layer
4 pressure-sensitive-adhesive layer
5 Separator
6 Surface protective film
10 Polarizing film
11 pressure-sensitive-adhesive layer attached polarizing film
100 Diamond intender (Berkovich type)
200 Sample
201 Transmittance axis direction of polarizer
202 Glass plate
203 Guitar pick
A Minimum load (μN) in load curve
B Maximum load $P_{max}$ (μN) in load curve
C Maximum displacement (nm)
D Minimum load (μN) in unload curve
E Displacement quantity (nm) in unload curve
F Arrow of pressure-sensitive-adhesion index
a Nano-slits

The invention claimed is:

1. A polarizing film, comprising a polarizer having a thickness of 10 μm or less, and a transparent resin layer on at least one surface of the polarizer,
wherein the polarizer comprises a polyvinyl alcohol-based resin, and is designed to have a single-body transmittance T and a polarization degree P representing optical properties satisfying the condition of the following formula:

$$P > -(10^{0.929T-42.4}-1) \times 100 \text{ provided that } T < 42.3 \text{ or}$$
$$P \geq 99.9 \text{ provided that } T \geq 42.3,$$

the transparent resin layer is a formed product of a transparent resin layer forming material comprising a water-based emulsion resin and has a hardness of 0.01 GPa or more, and
wherein the transparent resin layer has an indentation load of 1 to 60 μN, and the indentation load is measured by a nano-indentation method.

2. The polarizing film according to claim 1, comprising a relaxation layer in which an alignment of the polyvinyl alcohol-based resin is partially relaxed on a side of the polarizer on which the transparent resin layer is formed.

3. The polarizing film according to claim 2, wherein the relaxation layer has a thickness of ⅔ or less of the film thickness of the polarizer.

4. The polarizing film according to claim 2, wherein a thickness of the relaxation layer is 0.1 μm or more.

5. The polarizing film according to claim 1, wherein the transparent resin layer is a layer showing no pressure-sensitive adhesion properties.

6. The polarizing film according to claim 1, further comprising a protective film.

7. A process for producing the polarizing film recited in claim 1, comprising:
a step of applying the transparent resin layer forming material comprising a water-based emulsion resin directly onto at least one surface of the polarizer having a thickness of 10 μm or less, and
a step of drying a coating layer of the transparent resin layer forming material to form the transparent resin layer.

8. A pressure-sensitive-adhesive-layer-attached polarizing film, comprising the polarizing film recited in claim 1, and further comprising a pressure-sensitive-adhesive layer on a transparent-resin-layer-side of the polarizing film.

9. An image display device, comprising the pressure-sensitive-adhesive-layer-attached polarizing film recited in claim 8.

10. An image display device, comprising the polarizing film recited in claim 1.

* * * * *